(12) United States Patent
May

(10) Patent No.: US 6,522,275 B2
(45) Date of Patent: Feb. 18, 2003

(54) METHOD AND APPARATUS FOR SAMPLE RATE CONVERSION FOR USE IN AN ANALOG TO DIGITAL CONVERTER

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/779,158

(22) Filed: Feb. 8, 2001

(65) Prior Publication Data

US 2002/0145546 A1 Oct. 10, 2002

(51) Int. Cl.$^7$ .............................. H03M 3/00; H03M 7/00
(52) U.S. Cl. ........................................ 341/143; 341/61
(58) Field of Search .................. 341/143, 61; 370/545; 375/222, 240.05, 377, 240.16, 240.21; 708/313; 348/441

(56) References Cited

U.S. PATENT DOCUMENTS

| | | | |
|---|---|---|---|
| 4,851,841 A | | 7/1989 | Sooch |
| 5,512,895 A | * | 4/1996 | Madde et al. .................. 341/61 |
| 5,748,126 A | * | 5/1998 | Ma et al. ..................... 341/143 |
| 6,249,549 B1 | * | 6/2001 | Kim ......................... 375/240.2 |

OTHER PUBLICATIONS

"Delta–Sigma Data Converters—Therory, Design, and Simulation", IEE Press Marketing, Edited by Steven R. Norsworthy, Richard Schreier and Gabor C. Temes, copyright 1997 by the Institute of Electrical and Electronics Engineers, Inc., New copyright 1997 by the Institute of Electrical and Electronics Engineers, Inc., New York, NY.

"A High–Frequency and High–Resolution Fourth–Order ΣΔ A/D Converter in BiCMOS Technology", IEEE Journal of Solid–State Circuits, vol. 29, No. 8, Aug. 1994, By Guang-ming Yin, Student Member, IEEE, and Willy Sansen, Senior Member, IEEE.

\* cited by examiner

*Primary Examiner*—Patrick Wamsley
(74) *Attorney, Agent, or Firm*—Timothy W. Markison

(57) ABSTRACT

A method and apparatus for sample rate conversion in an analog to digital converter includes processing that begins by converting an analog input signal into a stream of digital data. The processing continues by determining an up sampling value and a down sampling value based on a sample rate conversion value. The processing continues by computing a moving sum of data of the stream of data based on the up sampling value, the clock rate of the stream of data, and a predetermined filter function. The processing continues by producing a digital output value from the moving sum based on the down sampling value, wherein the digital output value is at a desired output rate.

17 Claims, 14 Drawing Sheets

190

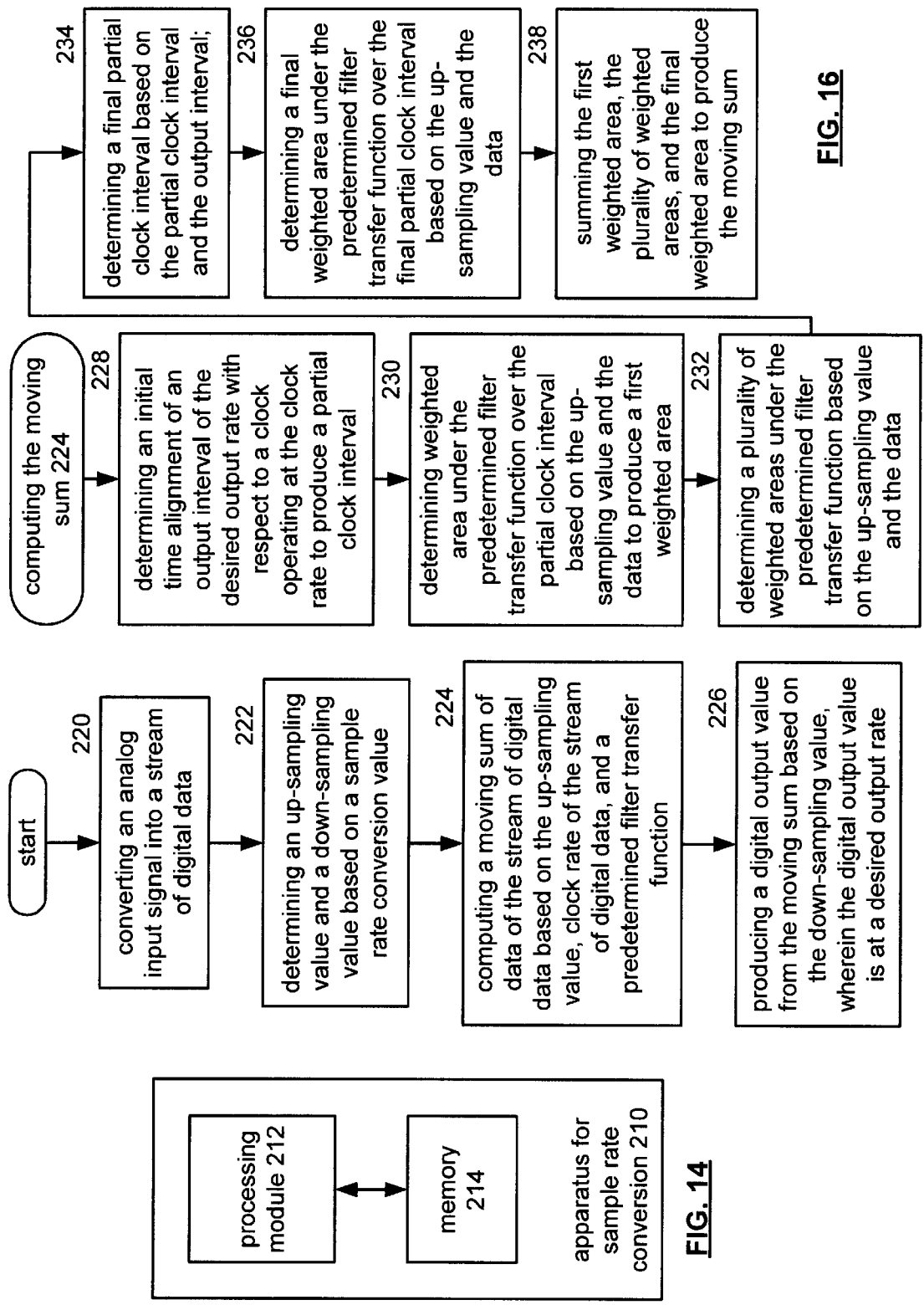

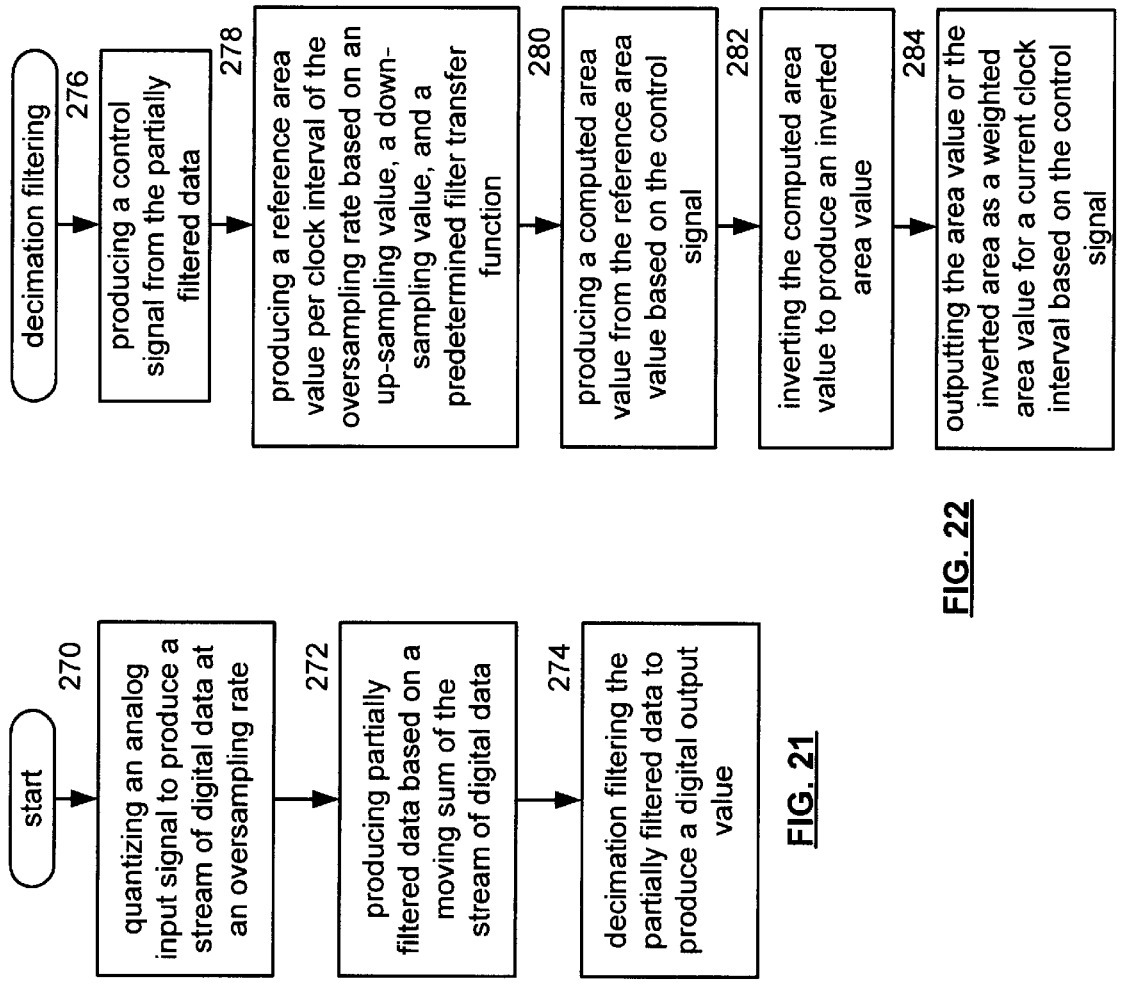
FIG. 22
FIG. 21
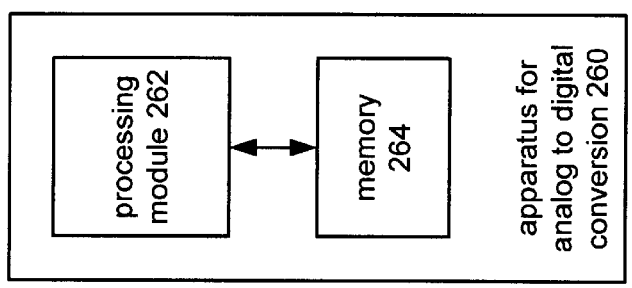
FIG. 20

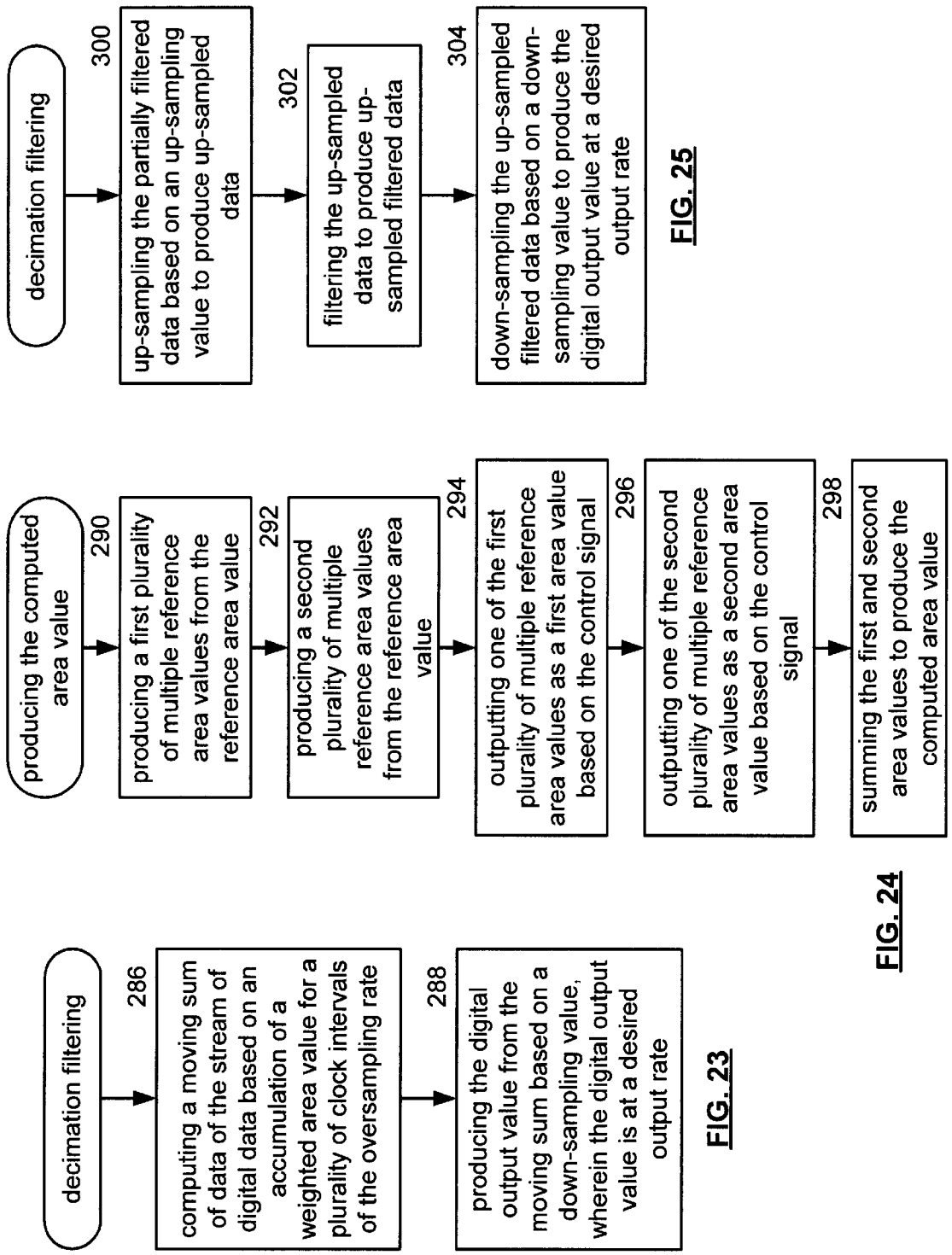

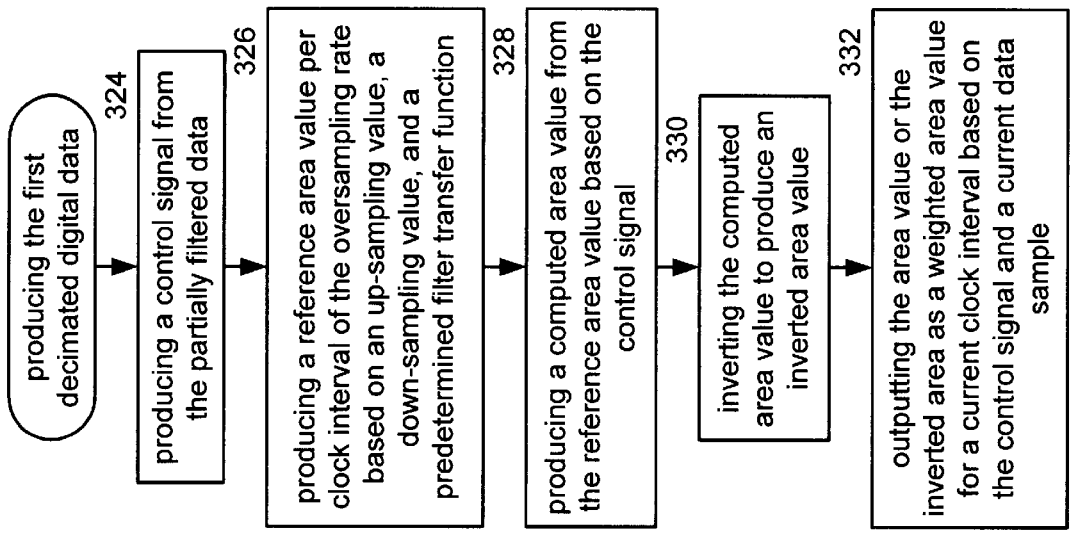
FIG. 28
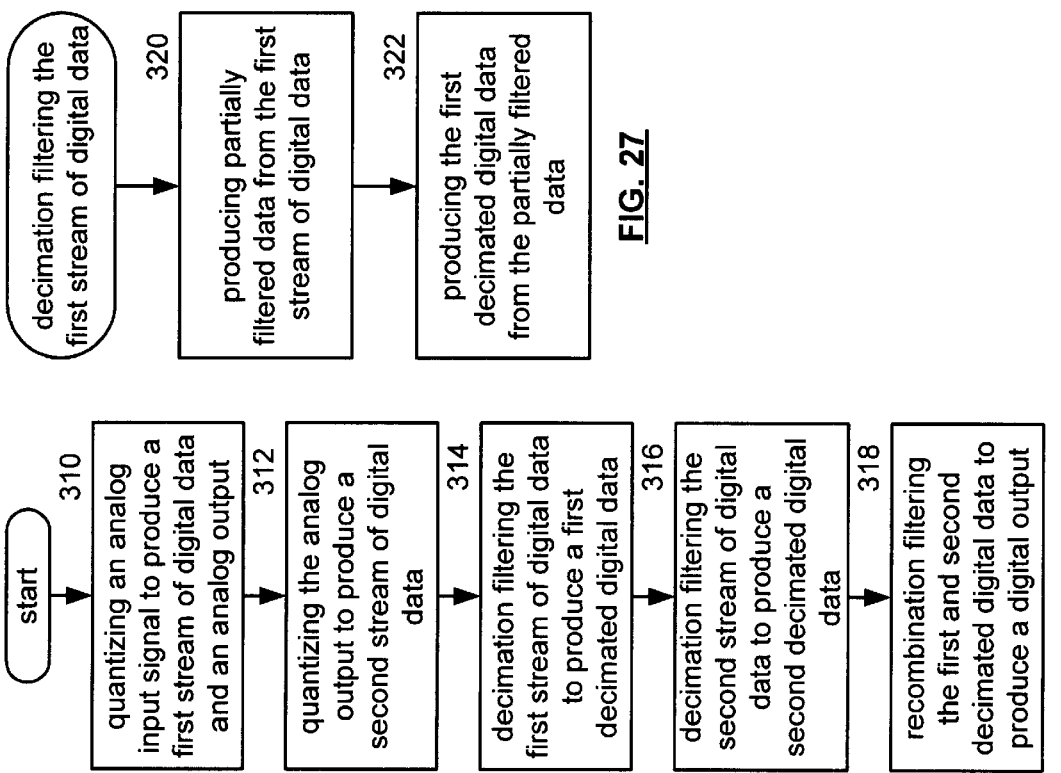
FIG. 27
FIG. 26

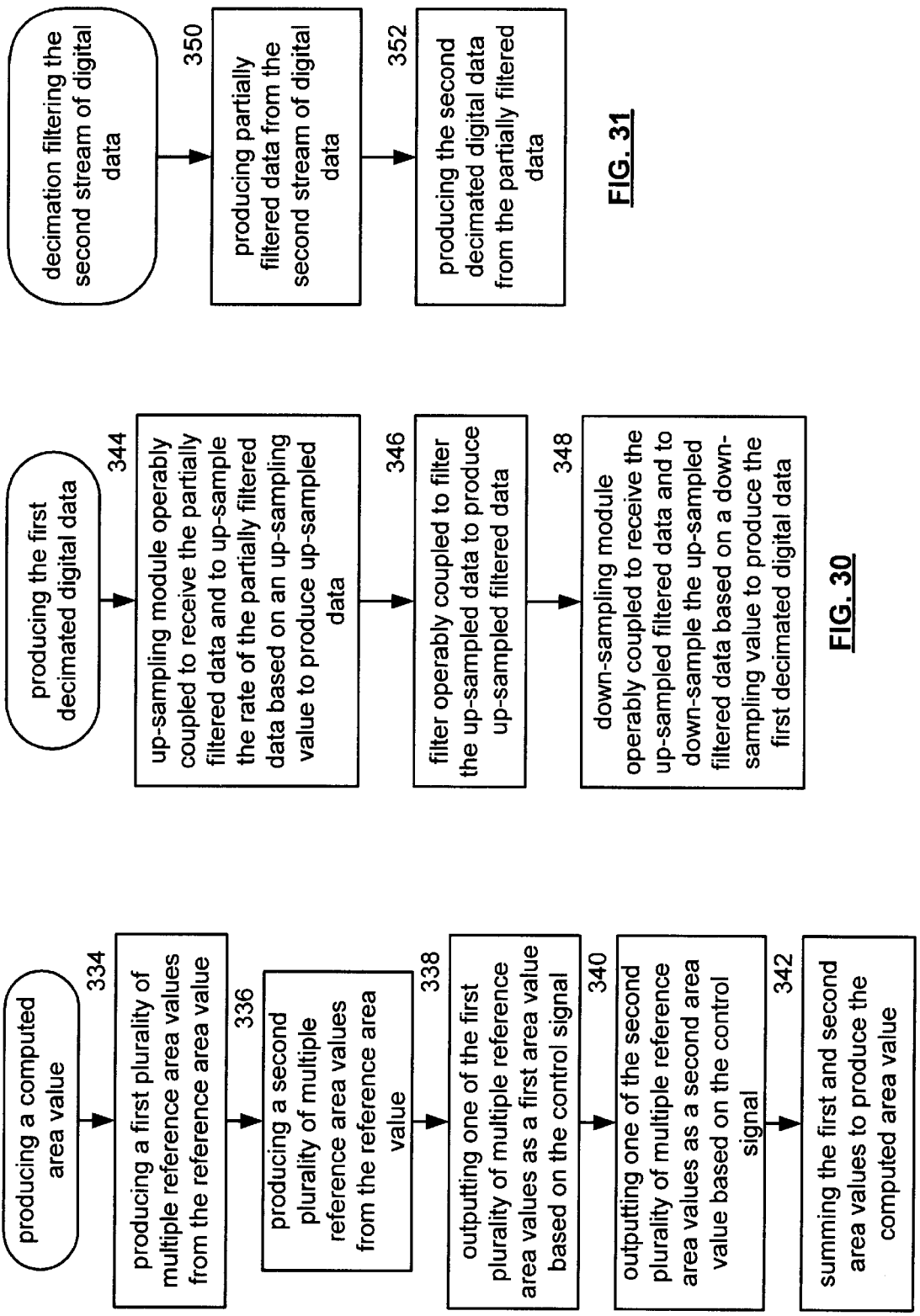

METHOD AND APPARATUS FOR SAMPLE RATE CONVERSION FOR USE IN AN ANALOG TO DIGITAL CONVERTER

TECHNICAL FIELD OF THE INVENTION

This invention relates generally to processing of data and more particularly to processing data by performing an analog to digital conversion with varying sample rates.

BACKGROUND OF THE INVENTION

Analog to digital converters are known to receive an analog signal and generate a corresponding digital signal. An analog to digital converter may be implemented using a variety of topologies. For example, an analog to digital converter may be implemented utilizing Sigma-Delta technology, mash converter technology, successive approximation technology, flash converter technology, or variations thereof. For example, a mash analog to digital converter is a variation of a Sigma-Delta modulator.

The order of an analog to digital converter, such as a Sigma-Delta analog to digital converter, varies depending on the application. For example, in audio applications, where the analog input signal range varies from 20 Hz to 20 Khz, a $2^{nd}$ order Sigma-Delta modulator analog converter works well. As the bandwidth of the signal range increases, the order of the modulator must also increase. For example, to process signals with a bandwidth up to 400 Khz, a $4^{th}$ order Sigma-Delta modulator, analog to digital converter is utilized.

FIG. 1 illustrates a schematic block diagram of a $4^{th}$ order Sigma-Delta analog to digital converter 10. The analog to digital converter 10 includes two $2^{nd}$ order Sigma-Delta modulators 12 and 14, a recombining filter 16 and a decimation filter 18. The decimation filter includes a $5^{th}$ order cascaded integrated comb (CIC) filter 20 and a finite impulse response (FIR) filter 22. In operation, the $2^{nd}$ order Sigma-Delta modulator 12 receives an analog input signal and samples it at a rate of N times the output sampling frequency ($F_s$). For example, if the output sampling frequency ($F_s$) is 700 Khz, the over sampling frequency of the Sigma-Delta modulator ($N*F_s$) may be approximately 35 Mhz. $2^{nd}$ order Sigma-Delta modulator 12 outputs a 1-bit data stream that is provided to the recombining filter 16 and produces an analog output that is provided to $2^{nd}$ order Sigma-Delta modulator 14. $2^{nd}$ order Sigma-Delta modulator 14 samples the analog output and produces a corresponding 1-bit stream of digital data.

The recombining filter 16 combines the 2 digital streams of data to produce a multi-bit stream of data. The $5^{th}$ order CIC filter 20, operating at a rate of some multiple of the output sampling rate ($M*F_s$), produces a digital filtered output. The FIR filter 22 further filters and down-samples the CIC filtered signal to produce the resulting digital output at the desired sampling rate ($F_s$).

The $4^{th}$ order Sigma-Delta A to D converter of FIG. 1 works well when the output is a fixed frequency. For digital communication protocols, such as digital subscriber line (DSL), asymmetrical digital subscriber lines (ADSL), universal asymmetrical digital subscriber lines (UADSL), high-speed digital subscriber line (HDSL), and symmetrical high-speed digital subscriber lines (SHDSL), the digital output rate may vary by a magnitude of 10. For example, for an SHDSL application, the analog to digital converter outputs digital symbols that may vary in rate from approximately 70 KHz to approximately 700 KHz. In such an application, the crystal producing the over sampling clock and the clock for the decimation filter cannot be varied by a magnitude of 10.

Therefore, a need exists for a method and apparatus of sample rate conversion within analog to digital converters having a higher order modulator.

BRIEF DESCRIPTION OF THE DRAWINGS

FIG. 14 illustrates a schematic block diagram of an apparatus for sample rate conversion in accordance with the present invention;

FIGS. 15 through 19 illustrate a logic diagram of a method for sample rate conversion in accordance with the present invention;

FIG. 20 illustrates a schematic block diagram of an apparatus for analog to digital conversion in accordance with the present invention;

FIGS. 21 through 25 illustrate a logic diagram of a method for an analog to digital conversion in accordance with the present invention; and FIGS. 26 through 31 illustrate a logic diagram of an alternate method for an analog to digital conversion in accordance with the present invention.

DETAILED DESCRIPTION OF A PREFERRED EMBODIMENT

Generally, the present invention provides a method and apparatus for sample rate conversion in an analog to digital converter. Such a method and apparatus includes processing that begins by converting an analog input signal into a stream of digital data. The processing continues by determining an up sampling value and a down sampling value based on a sample rate conversion value. For example, if the analog to digital converter is designed to have a sampling rate of approximately 35 Mhz and a maximum output sampling frequency of 700 Khz, and a new desired output sampling frequency sampling rate is 500 Khz, the sample rate conversion value is 5/7ths. From this, an up sampling value can be determined to be 5 while a down sampling value can be determined to be 7. The processing continues by computing a moving sum of data of the stream of data based on the up sampling value, the clock rate of the stream of data, and a predetermined filter function. This will be discussed in greater detail with reference to FIGS. 5 through 7. The processing continues by producing a digital output value from the moving sum based on the down sampling value, wherein the digital output value is at a desired output rate. With such a method and apparatus, sample rate conversion may be done in an analog to digital converter without the need for generating an extremely high clock rate to accommodate up sampling values. As such, the sample rate conversion of the present invention may be used in $2^{nd}$ order, $3^{rd}$ order, $4^{th}$ order, et cetera analog to digital converters to provide accurate sample rate conversion with minimal extra circuitry and cost.

Figure 1:
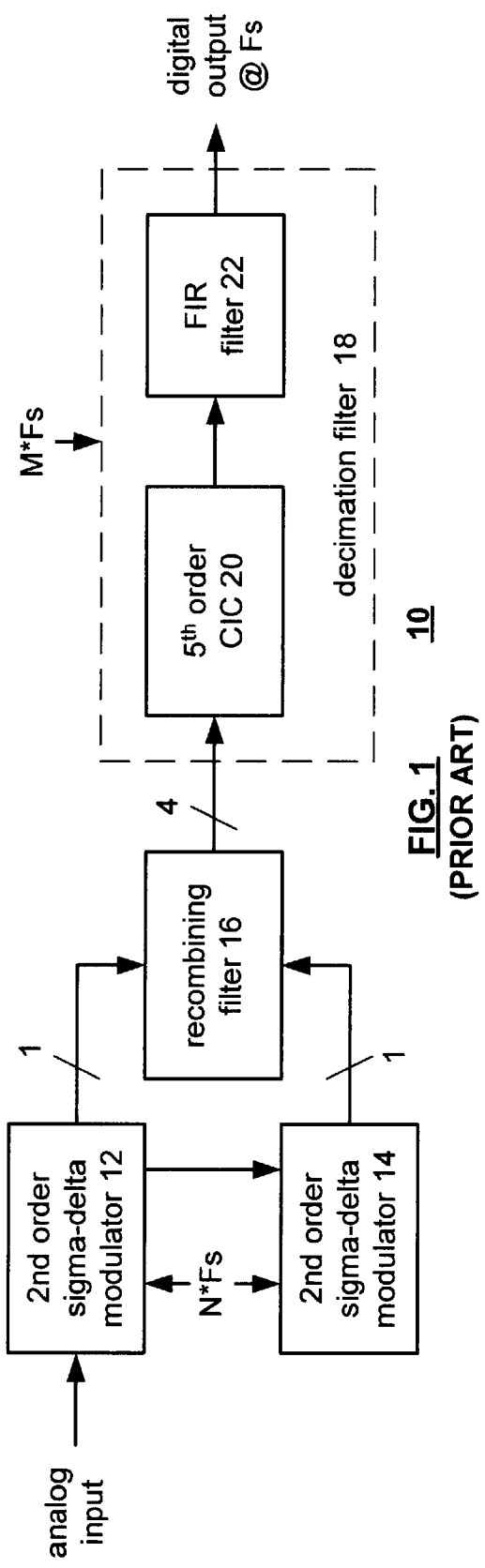
FIG. 1 illustrates a schematic block diagram of a $4^{th}$ order Sigma-Delta analog to digital converter of the prior art.
Figure 2:
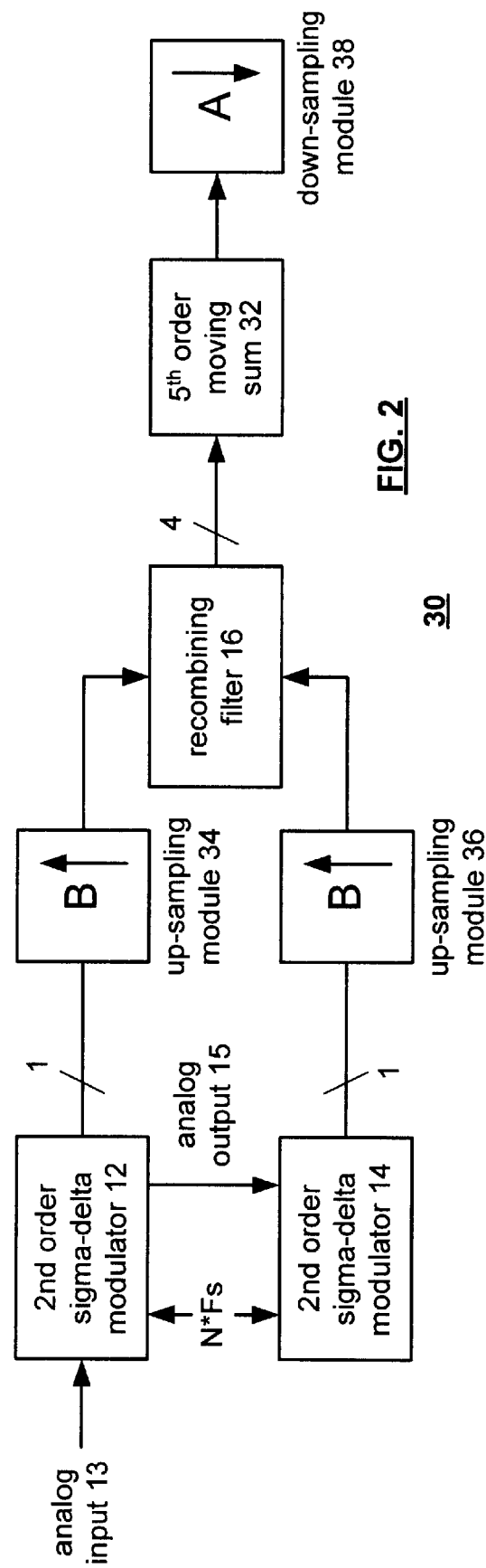
FIG. 2 illustrates a schematic block diagram of an analog to digital converter having sample rate conversion in accordance with the present invention.

The present invention can be more fully described with reference to FIGS. 2 through 31. FIG. 2 illustrates a schematic block diagram of an analog to digital converter 30 that includes sample rate conversion. The analog to digital converter 30 includes $2^{nd}$ order Sigma-Delta modulator 12, $2^{nd}$ order Sigma-Delta modulator 14, up sampling module 34, up sampling module 36, the recombining filter 16, a $5^{th}$ order moving sum 32 and a down sampling module 38. The $2^{nd}$ order Sigma-Delta modulator 12 receives an analog input 13 and produces therefrom a stream of digital data and an analog output 15. The stream of digital data is provided to up sampling module 34. The $2^{nd}$ order Sigma-Delta modulator 14 receives the analog output 15 and produces a 1 bit stream of digital data, which is provided to up sampling module 36. The over sampling rate used by $2^{nd}$ order Sigma-Delta modulators 12 and 14 is based on an over sampling rate (N) with respect to the Nyquist sampling rate ($F_s$). For example, in an SHDSL application, the Nyquist sampling rate is approximately 700 Khz where the over sampling ratio may be approximately 50 such that the sampling rate is approximately 35 Mhz.

Up sampling modules 34 and 36 receive the respective streams of data and increase the rate of the digital streams. The amount of which the rate of the digital stream is increased is based upon the desired sample rate conversion. The desired sample rate conversion will generally be dictated by the specification in which the analog to digital converter will be utilized. For example, the SHDSL specification indicates that the output of an analog to digital converter will need to vary the output sampling rate from approximately 70 Khz to 700 Khz. The specification may also indicates the frequency percentage steps that the output sampling rate should be increased. For example, the percent increase may be $\frac{1}{3}^{rd}$ of a percent, such that the output sampling may be adjusted by $\frac{1}{3}^{rd}$ of a percent. For example, the 700 Khz output sampling rate may be reduced to 697.7 Khz (i.e., ⅓ of a percent decrease from 700 KHz). In this instance, the up sampling value and down sampling value are integers. To achieve this kind of granularity, the up sampling value may be 300 while the down sampling value is 301. With an up sampling value of 300, the up sampling modules 34 and 36 are required to have a 10.5 gigahertz clock, when the over sampling rate of the modulators 12 and 14 is 35 Mhz.

The recombining filter 16 combines the outputs of up sampling modules 34 and 36 to produce a 4 bit digital stream. A $5^{th}$ order moving sum 32 receives the 4 bit digital stream and produces a multi-bit digital output that is subsequently down sampled by down sampling module 38. The $5^{th}$ order moving sum essentially computes the area under the curve of the $5^{th}$ order transfer function for a given down sampling interval. A $5^{th}$ order moving sum will be a complex function. As such, a computational engine that performs a $5^{th}$ order moving sum is quite complex.

Figure 3:
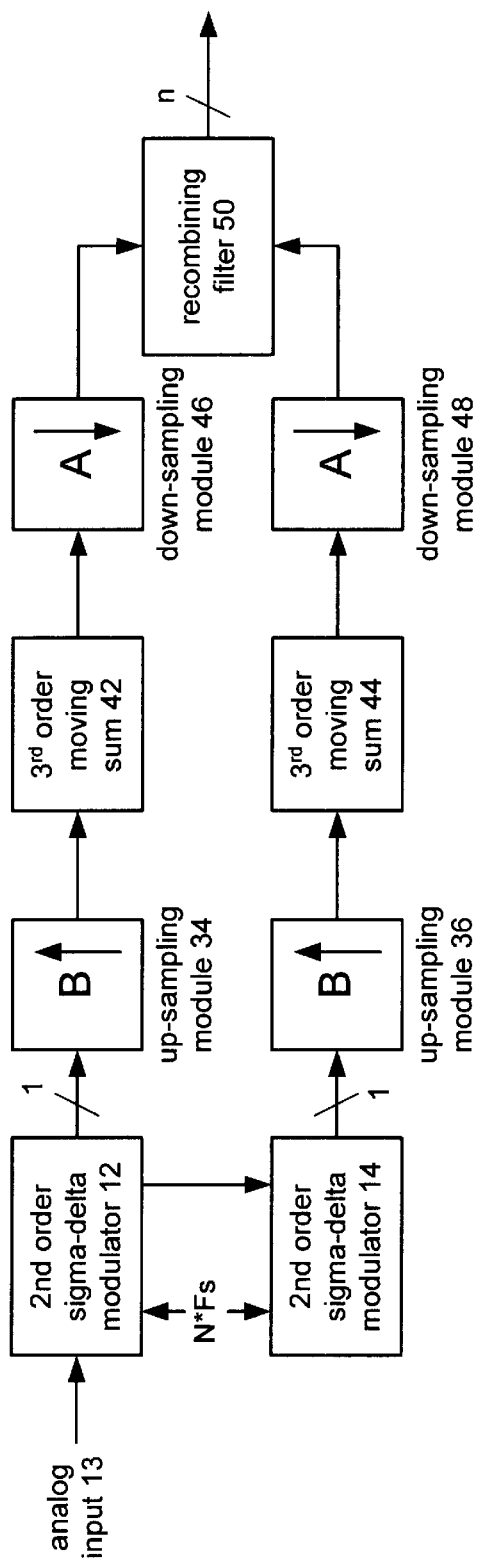
FIG. 3 illustrates a schematic block diagram of an alternate analog to digital converter that includes sample rate conversion in accordance with the present invention.

FIG. 3 illustrates a schematic block diagram of an alternate analog to digital converter 40 that includes the $2^{nd}$ order modulators 12 and 14, up sampling modules 34 and 36, $3^{rd}$ order moving sums 42 and 44, the down sampling modules 46 and 48 and a recombining filter 50. Due to the linearity properties of digital filters and the down-sampling and up-sampling operations, the analog to digital converter of FIG. 2 may be reconfigured as shown in FIG. 3. The functions of the Sigma-Delta modulators 12 and 14 are as previously discussed, as well as the functionality of the up sampling modules 34 and 36. By utilizing the fact that linear operators may be implemented in any order, the recombining filter 50 is moved after the moving sum modules 42 and 44. Each path now includes a $3^{rd}$ order moving sum 42 and 44, each operates only on the output of the corresponding $2^{nd}$ order sigma-delta modules 12 and 14. The $3^{rd}$ order moving sum includes a $3^{rd}$ order transfer function that may include a quadrate component. As such, the mathematics required to determine the area under such a transfer function is substantially reduced in comparison with the $5^{th}$ order moving sum. The resultant moving sums are down sampled via the corresponding down sampling modules 46 and 48 and then recombined via the recombining filter 50. The resultant is a multi-bit digital output value.

Figure 4:
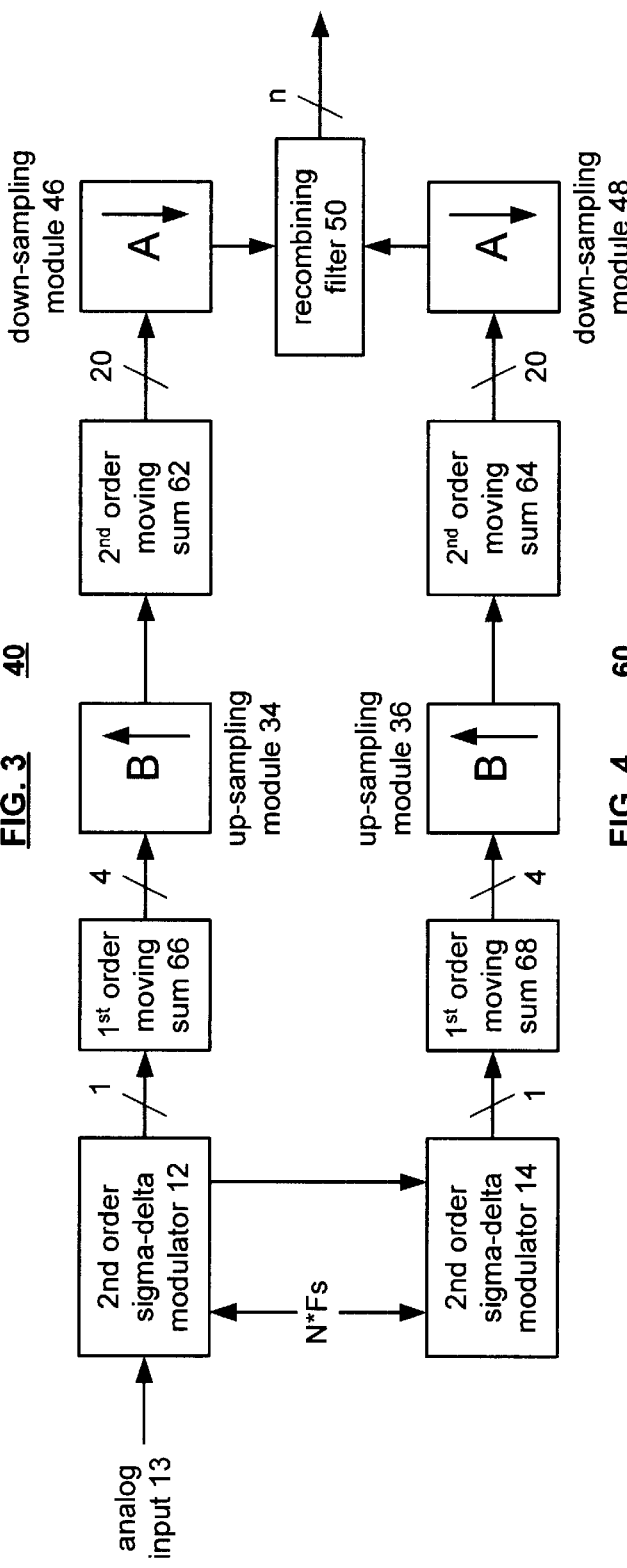
FIG. 4 illustrates a schematic block diagram of another analog to digital converter having sample rate conversion in accordance with the present invention.

FIG. 4 illustrates a schematic block diagram of yet another analog to digital converter 60. Analog to digital converter 60 further utilizes the linearity properties of filter functions. In this embodiment, the analog to digital converter 60 includes the $2^{nd}$ order Sigma-Delta modulators 12 and 14, two $1^{st}$ order moving sums 66 and 68, the up sampling modules 34 and 36, two $2^{nd}$ order moving sums 62 and 64, the down sampling modules 46 and 48, and the recombining filter 50. The $1^{st}$ order moving sums 66 and 68 produce a 4-bit numerical value based on sampling of the digital stream of data. Details of the $1^{st}$ order moving sum will be discussed in greater detail with reference to FIG. 12. The up sampling modules 34 and 36 receive the 4-bit values from the respective $1^{st}$ order moving sums 66 and 68 to produce up sampled data. The $2^{nd}$ order moving sums 62 and 64, which will include a linear function, compute 20-bit digital values. The 20-bit digital values are down sampled via down sampling modules 46 and 48 which are recombined via recombining filter 50 to produce an n-bit digital output value.

Figure 5:
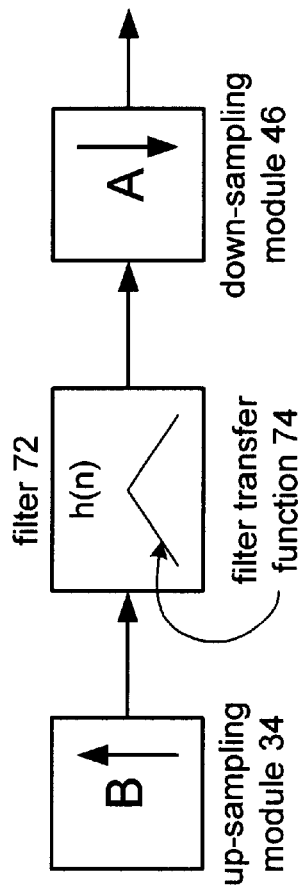
FIG. 5 illustrates a schematic block diagram of a portion of a decimation filter including sample rate conversion in accordance with the present invention.

FIG. 5 illustrates a schematic block diagram of a portion of the decimation filter 70 that includes the up sampling module 34, a filter 72, and a down sampling module 46. In this configuration, the filter transfer function 74 is shown as a linear function (h(n)). By utilizing the configuration of FIG. 5, the up sampling and down sampling of information may be done within the filter 72 by calculating weighted averages. As such, the need to produce a very high rate clock signal (for example, 10.5 gigahertz) is eliminated.

Figure 6:
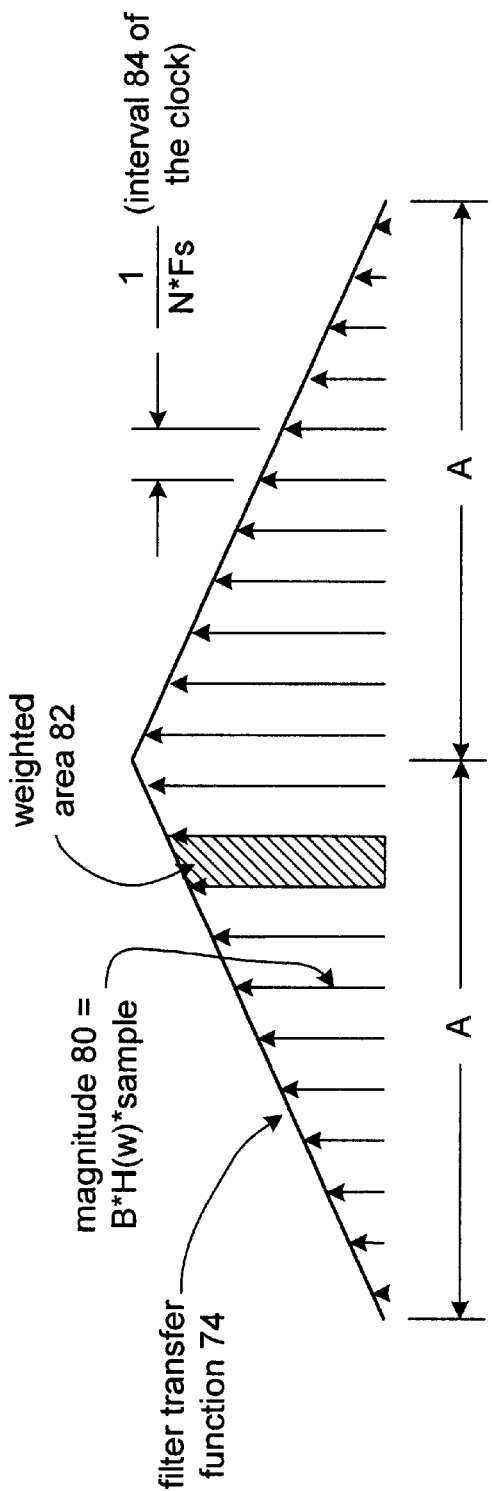
FIG. 6 illustrates a graphical representation of computing sample rate conversion in accordance with the present invention.

FIG. 6 illustrates a graphical representation of computing the weighted areas of the decimation filter of FIG. 5. As shown, the filter transfer function 74 is triangular in shape, which represents a second order moving sum. The positive and negative slopes of the transfer function 74 each correspond to a down sampling interval, wherein one sampling interval (A) corresponds to the positive slope of the triangle and a second sampling interval (A) corresponds to the negative slope of the triangle. As such, for the filter transfer function 74, two down sampling values are computed using the entire filter transfer function 74, one for each interval (A). In operation, two identical filter transfer functions are used, one offset from the other based on the down-sampling interval (A). In this way, at every down-sampling interval (A) the result of one of the two filter transfer functions is complete and the output sample is produced. The result is taken from alternating filter function computations as each one is calculated. The magnitude for each sample, which occurs at intervals 84 of the clock, which is represented by $1/(N*F_s)$ (i.e. the sampling clock period), is based on the up sampling value B, the transfer function magnitude at the corresponding interval, and the magnitude of the sample. As such, the magnitude 80 can be readily calculated by having the up sampling value, the current sample of the data stream corresponding to the particular interval 84 and the corresponding position within the transfer function 74. By computing a difference between successive triangles, the weighted area 82 may be determined for a given interval. By determining the weighted area 82 for each interval that spans the transfer function 74, the corresponding sample rate converted value is determined. As one of average skill in the art will appreciate, a reference area may be readily determined based on the up-sampling rate, the down-sampling rate, and the transfer function. The reference area may then be weighted based on the value of the current data sample of the stream of data for a given interval of the oversampling clock.

Figure 7:
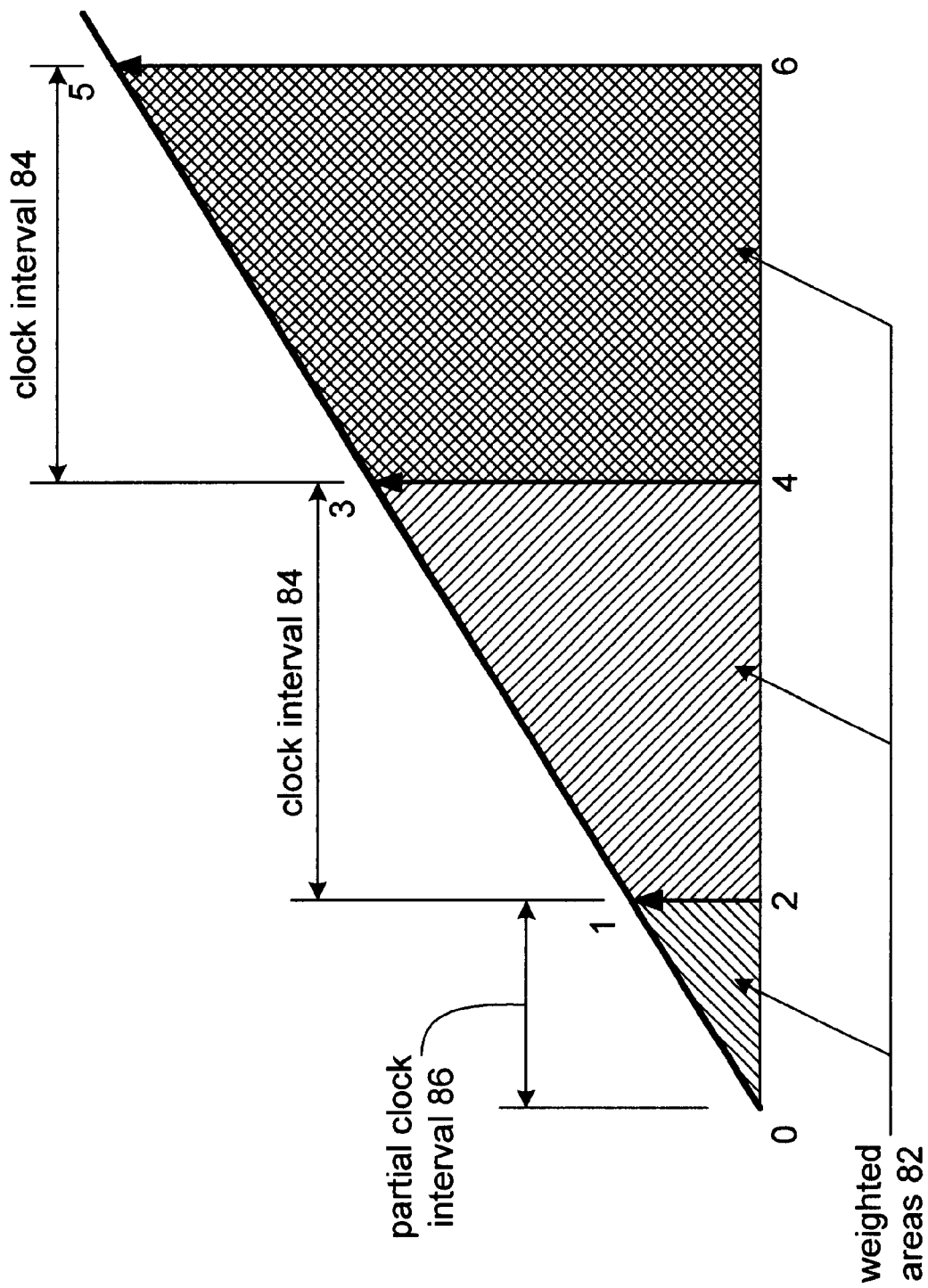
FIG. 7 illustrates a graphical representation of a portion of FIG. 6 for determining the sample rate conversion in accordance with the present invention.

FIG. 7 illustrates an expanded view of a portion of the transfer function of FIG. 6. In this illustration, the $1^{st}$ few samples are determined. At the beginning of the down sampling interval, a partial clock interval 86 is determined. Correspondingly, a partial weighted area 82 is determined based on the triangle having points 0, 1, 2. At the next interval, the magnitude of the triangle 0, 3, 4 is calculated based on the up sampling value B, the transfer function at this point, and the corresponding sample for this interval. To determine the weighted area 82 for this particular interval, the area of triangle 0, 1, 2 is subtracted from triangle 0, 3, 4 and the result is weighted by the ADC sample output for this interval. For the next clock interval, the area under triangle 0, 5, 6 is calculated. To determine the weighted area for this interval, the area of triangle 0, 3, 4 is subtracted from the area of triangle 0, 5, 6 and the result is weighted by the ADC sample output for this interval. As such, the weighted areas for each interval are computed using the $2^{nd}$ order moving sum transfer function until each interval over the down sampling period is determined. Once this is determined, the $1^{st}$ weighted area, the plurality of other areas and a final weighted area are summed to produce the moving sum for this particular down sampling interval. From this moving sum value, the recombining filter 50 combines it with the other paths moving sum to produce the digital output value.

Figure 8:
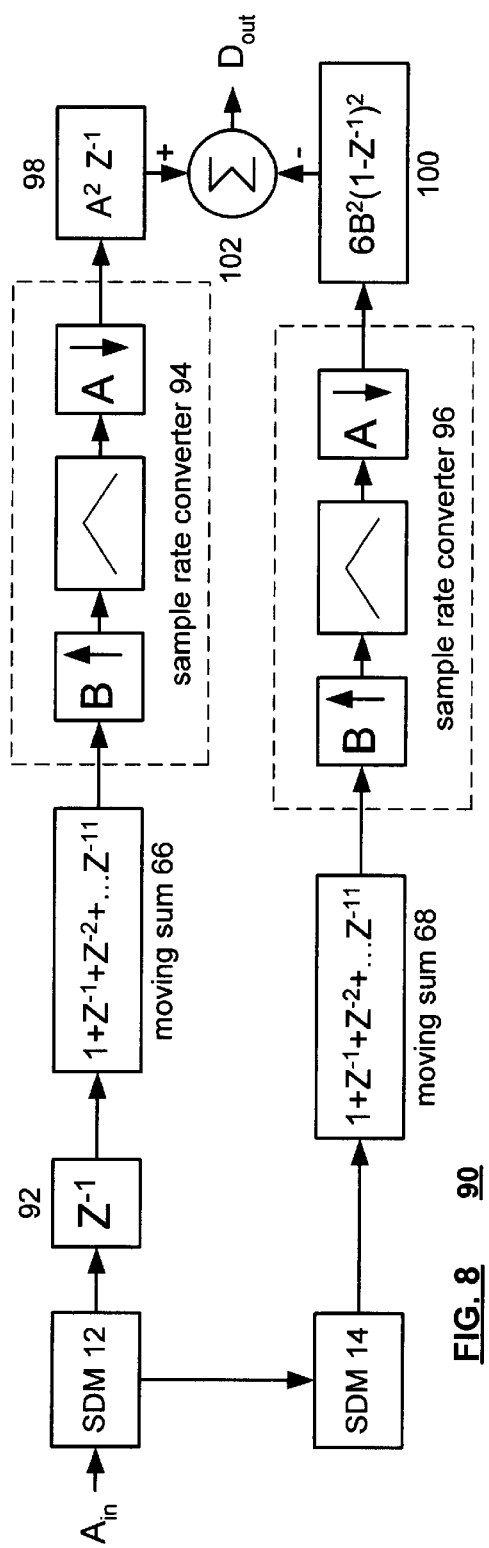
FIG. 8 illustrates a schematic block diagram of yet another analog to digital converter including sample rate conversion in accordance with the present invention.

FIG. 8 illustrates a schematic block diagram of yet another analog to digital converter 90. The analog to digital converter 90 includes the Sigma-Delta modulators 12 and 14, a delay element 92, the $1^{st}$ order moving sums 66 and 68, sample rate converters 94 and 96 within decimation filters, delay module 98, differentiator 100 and a summing module 102. Sample rate converter 94 along with the delay module 98 produce a decimation filter for the $1^{st}$ path. Similarly, sample rate converter 96 and differentiator 100 form a decimation filter for the $2^{nd}$ path.

In operation, the Sigma-Delta modulators 12 and 14 perform as previously described to produce a digital stream of data. Delay element 92 causes a one-clock delay such that the $1^{st}$ and $2^{nd}$ paths are phase aligned. The $1^{st}$ and $2^{nd}$ moving sums 66 and 68 perform the corresponding linear function of $1+Z^{-1}+Z^{-2}+\ldots Z^{-11}$. The sample rate converters 94 and 96 perform the functions as described with reference to FIGS. 5 through 7 to produce a moving sum of the corresponding paths. The delay module 98 and differentiator 100 perform the corresponding differentiation functions as indicated within the respective boxes. For example, delay module 98 performs the delay function of $A^{2}*Z^{-1}$ while differentiator 100 performs the differentiation function $B^{2}*(1-Z^{-1})^{2}$. The summing module 100 subtracts the $2^{nd}$ path, which is provided by the differentiator 100 from the $1^{st}$ path, which is provided by delay module 98, to produce a digital output.

Figure 9:
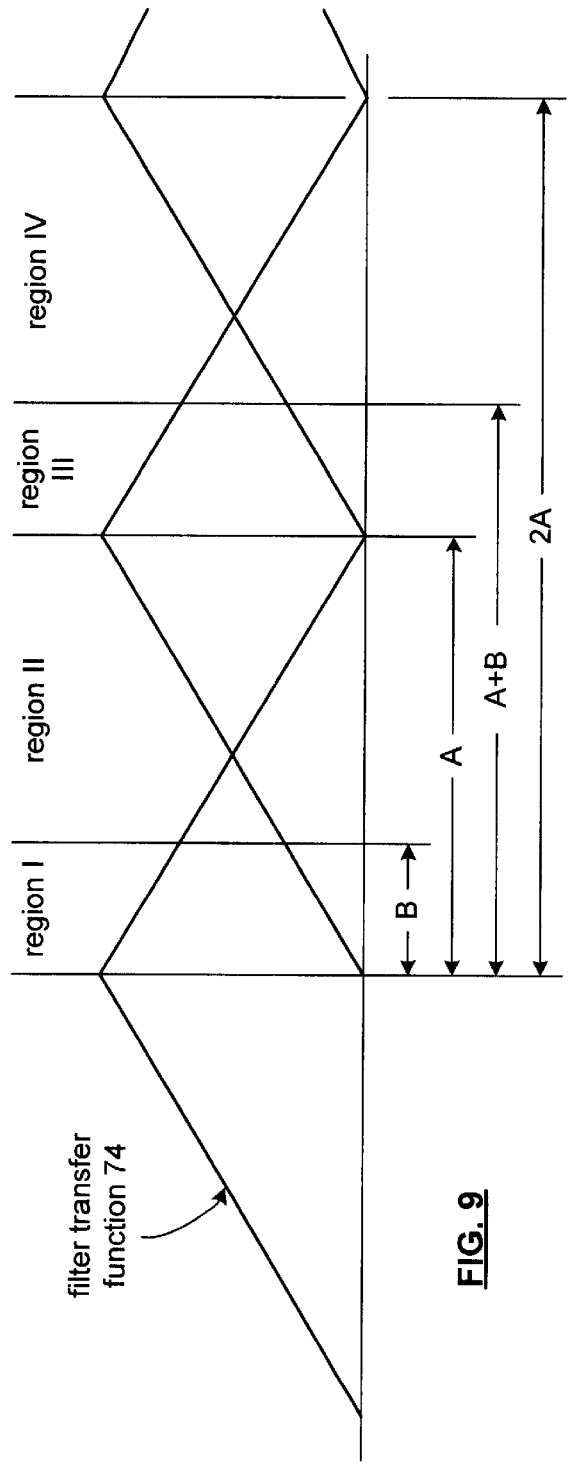
FIG. 9 illustrates a graphical representation of determining sample rate conversion in accordance with the present invention.

FIG. 9 illustrates a graphical representation of pipeline processing of the sample rate conversions as previously discussed. The filter transfer function 74 is shown in a repetitive pattern wherein, at each down sampling interval A, a new transfer function is begun. By illustrating the transfer functions in this over lapping manner, four distinct regions are readily determined. The $1^{st}$ region encompasses the up sampling value, the $2^{nd}$ region corresponds to the difference between the down sampling value and the up sampling value, the $3^{rd}$ region corresponds to a difference between the up sampling value plus the down sampling value less the down sampling value. The $4^{th}$ region corresponds to the difference between twice the down sampling value and the up sampling value plus the down sampling value. Based on these regions, small algorithms may be written to calculate the moving sums for each filter transfer function within these regions.

For example, the following represents an example of the code used to determining the moving sums based on the region in which the current sample lies.

```
#include <stdlib.h>
#include <stdio.h>
#include <math.h>
#define SIMTYPE 0
#define PI 3.141592654
#define FS 35.328e6
#define N 16384.0
#define FIRLENGTH 12 /* length of moving average
   between ADC and SRC */
main (int argc, char *argv[ ])
char *junk;
long max, temp, k, j, I, adcout, DATARATEINDEX,
   cic1A=0, cic2A=0, count;
long h[828*3];
double a, b, FCH, vin, adc1=0, adc2=0, adc3=0, adc4=0,
   osr, noise, output=0;
int cmp12out=1, pcmp12out=1, ppcmp12out=1,
   cmp34out=1, pcmp34out=1, ppcmp34out=1,
adc1out [FIRLENGTH], adc2out [FIRLENGTH],
   adc1fir=0, adc2fir=0;
longsrcreg=0, areaA=0, areaB=0, pareaA=0, pareaB=0,
   src1=0, psrc1=0, src2=0, psrc2=0, ppsrc2=0, outa=0,
   outb=0, cic1B, cic2B;
```

```
double ma1 [MA], ma2 [MA], ma3 [MA], ma4 [MA],
   ma5 [MA], maout;
if (argc !=2) printf ("ERROR in txpath.c: need
   DATARATEINDEX/n");
DATARATEINDEX=(int) (strtod (argv [1], &junk));
osr=828.0/(25.0+(float) DATARATEINDEX) *1.0;
srcreg=0;
a=osr;
b=N;
FCH=FS/a/b*2.0;
if (SIMTYPE==0) count=(1200*12*1104/
   (DATARATEINDEX+25));
if (SIMTYPE==3) count=(long)(4000.0*16.0*osr);
for (i=0, j=0; i <count; i++)
   {
   for (k=(FIRLENGTH -1); k>0; k--)
      {
      adc1out [k]=adc1out [k-1];
      adc2out [k]=adc2out [k-1];
      adc1fir=adc1fir+adc1out [k];
      adc2fir=adc2fir+adc2out [k];
      }
   adc1out [0]=pcmp12out;
   adc2out [0]=cmp34out;
   adc1fir=adc1fir+adc1out [0];
   adc2fir=adc2fir+adc2out [0];
   pareaA=areaA;
   pareaB=areaB;
   /************* region I *********************/
   if (srcreg<(DATARATEINDEX+25))
      areaA=(srcreg*(srcreg+1))>>1;
      psrc1=src1;
      ppsrc2=psrc2;
      psrc2=src2;
      src1=cic1A+pareaA*adc1fir;
      src2=cic2A+pareaA*adc2fir;
      cic1A=areaA*adc1fir;
      cic2A=areaA*adc2fir;
      outa=1;
      areaB=((828-srcreg)*(829-srcreg))>>1;
      cic1B=cic1B+(829*828-areaB-pareaB)*adc1fir;
      cic2B=cic2B+(829*828-areaB-pareaB)*adc2fir;
   /************ region II *********************/
   if ((srcreg>=(DATAREATEINDEX+25)) &&
      (srcreg<828))
      {
      areaA=(srcreg*(srcreg+1))>>1;
      cic1A=cic1A+(areaA-pareaA)*adc1fir;
      cic2A=cic2A+(areaA-pareaA)*adc2fir;
      areaB=((828-srcreg)*(829-srcreg))>>1;
      cic1B=cic1B+(pareaB-areaB)*adc1fir;
      cic2B=cic2B+(pareaB-areaB)*adc2fir;
      }
   /************      region      III
   *********************/
   if ((srcreg>=828) && (srcreg<(828+
      DATARATEINDEX+25
   )))
      {
      areaA=((828*2-srcreg)*(828*2+1-srcreg))>>1;
      cic1A=cic1A+(829*828-areaA-pareaA)*adc1fir;
      cic2A=cic2A+(829*828-areaA-pareaA)*adc2fir;
      areaB=((srcreg-828)*(srcreg-827))>>1
      psrc1=src1;
      ppsrc2=psrc2;
      psrc2=src2;
      src1=cic1B+pareaB*adc1fir;
      src2=cic2B+pareaB*adc2fir;
      outb=1;
      cic1B=areaB*adc1fir;
      cic2B=areaB*adc2fir;
      }
   /************      region      IV
   *********************/
   if ((srcreg>=(828+DATARATEINDEX+25)) && (srcreg
      <2*828
      {
      areaA=(828*2-srcreg)*(828*2+1-srcreg))>>1;
      cic1A=cic1A+(pareaA-areaA)*adc1fir;
      cic2A=cic2A+(pareaA-areaA)*adc2fir;
      areaB=((srcreg-828)*(srcreg-827)) >>1;
      cic1B=cic1B+(areaB-pareaB)*adc1fir;
      cic2B=cic2B+(areaB-pareaB)*adc2fir;
      }
   srcreg=((srcreg+DATARATEINDEX+25) % (828*2));
   /**/
   if ((outa==1) (outb==1)) /**/
      output=-(double) ((DATARATEINDEX+25)*
      (DATARATEINDEX+25))*6.0*(double) (src2
      output=output+(double) (828*828)*(double) psrc1;
      outa=0;
      outb=0;
```

Figure 10:
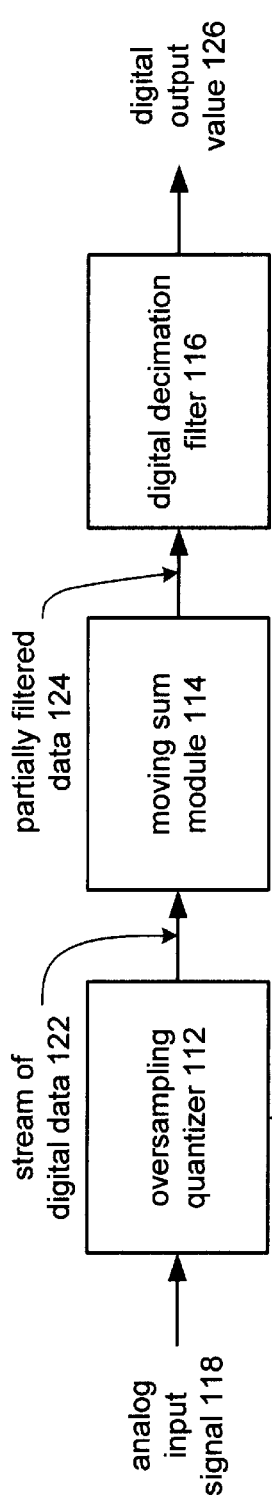
FIG. 10 illustrates a schematic block diagram of yet another analog to digital converter in accordance with the present invention.

FIG. 10 illustrates a schematic block diagram of an analog to digital converter 10 that includes an over sampling quantizer 112, a moving sum module 114, and a digital decimation filter 116. The over sampling quantizer, which may be a $2^{nd}$ order Sigma-Delta modulator, receives an analog input signal 118 and produces a stream of digital data 122. The moving sum module 114 receives the stream of digital data 122 and produces partially filtered data 124. The moving sum 114 may be a $1^{st}$ order, $2^{nd}$ order, or $3^{rd}$ order moving sum as previously described. The digital decimation filter 116, which includes sample rate conversion processing, receives the partially filtered data 124 and produces a digital output value 126. Note that the over sampling quantizer 112 produces the stream of digital data 122 based on an over sampling clock 120.

Figure 11:
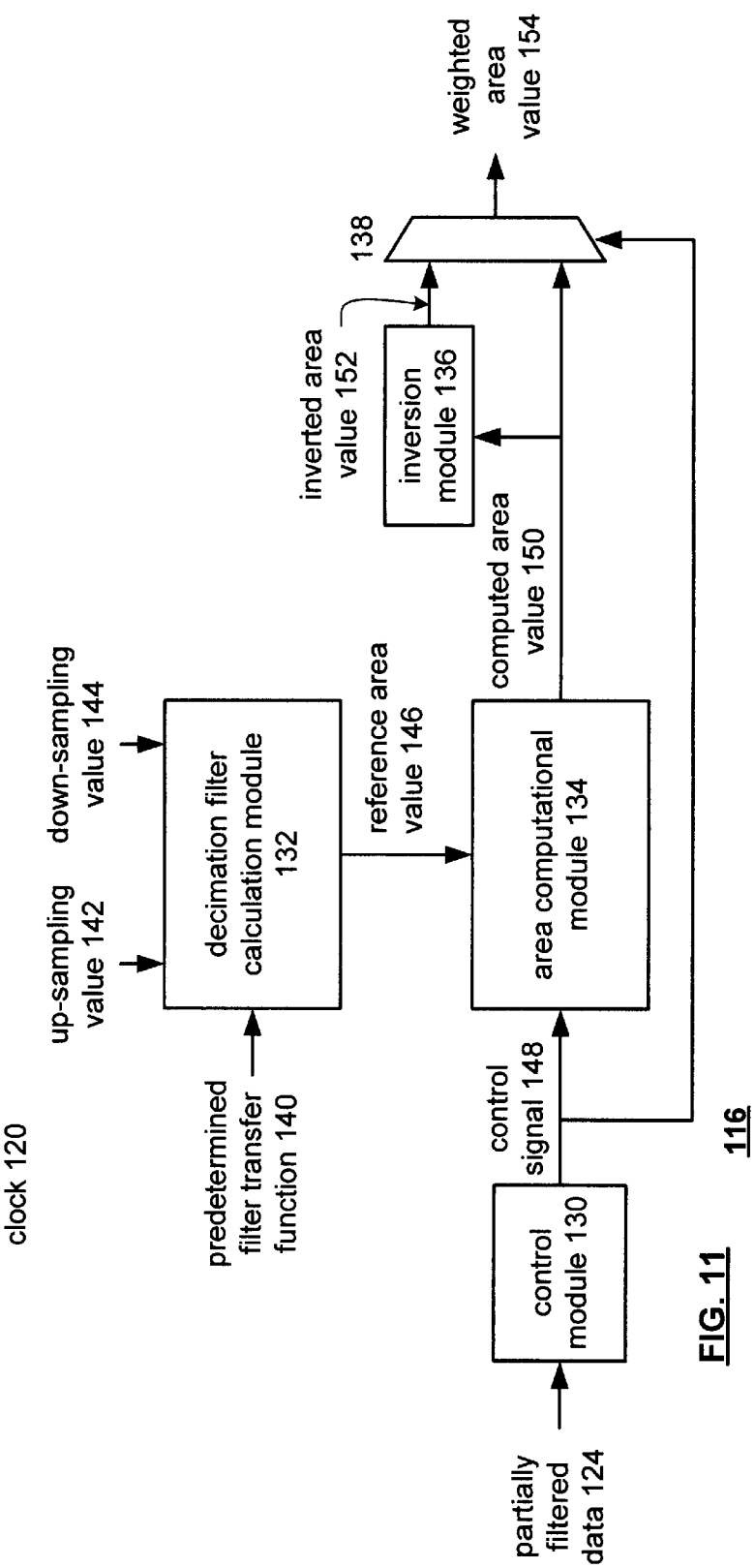
FIG. 11 illustrates a schematic block diagram of a decimation filter including sample rate conversion in accordance with the present invention.

FIG. 11 illustrates a schematic block diagram of the digital decimation filter 116. The digital decimation filter 116 includes a control module 130, a decimation filter calculation module 132, an area computational module 134, an inversion module 136, and a multiplexor 138. In operation, the control module 130 is operably coupled to receive the partially filtered data 124 and produce a control signal 148. The control module 130 provides the control signal 148 to the area computational module 134 and to multiplexor 138.

The decimation filter calculation module 132 receives an up sampling value 142, a down sampling value 144, and a predetermined filter transfer function 140. Based on these inputs, the decimation filter calculation module 132 produces a reference area value 146. Recall from FIG. 2 that the filter transfer function is a triangular function wherein the up sampling value B and the down sampling value A may be readily utilized to calculate the weighted areas for each interval and to determine the reference area value 146 for each interval.

The area computational module 134 receives the reference area value 146 and the control signal 148 to produce a computed area value 150. The control signal 148 is representative of the data samples contained within the digital data stream 122. The reference area value 146 is a generic representation of the weighted area of FIG. 6. The computed area value 150 therefore, is the actual weighted area for a given interval less magnitude. The inversion module 136 receives the computed area value 150 to produce an inverted area value 152. Based on the control signal, the multiplexor 138 outputs the inverted area value 150 or the computed area value 150 as the weighted area value of 154. As such, based on a sign bit of the control signal, the computed area value 150 or the inverted area value 152 will be outputted.

Figure 12:
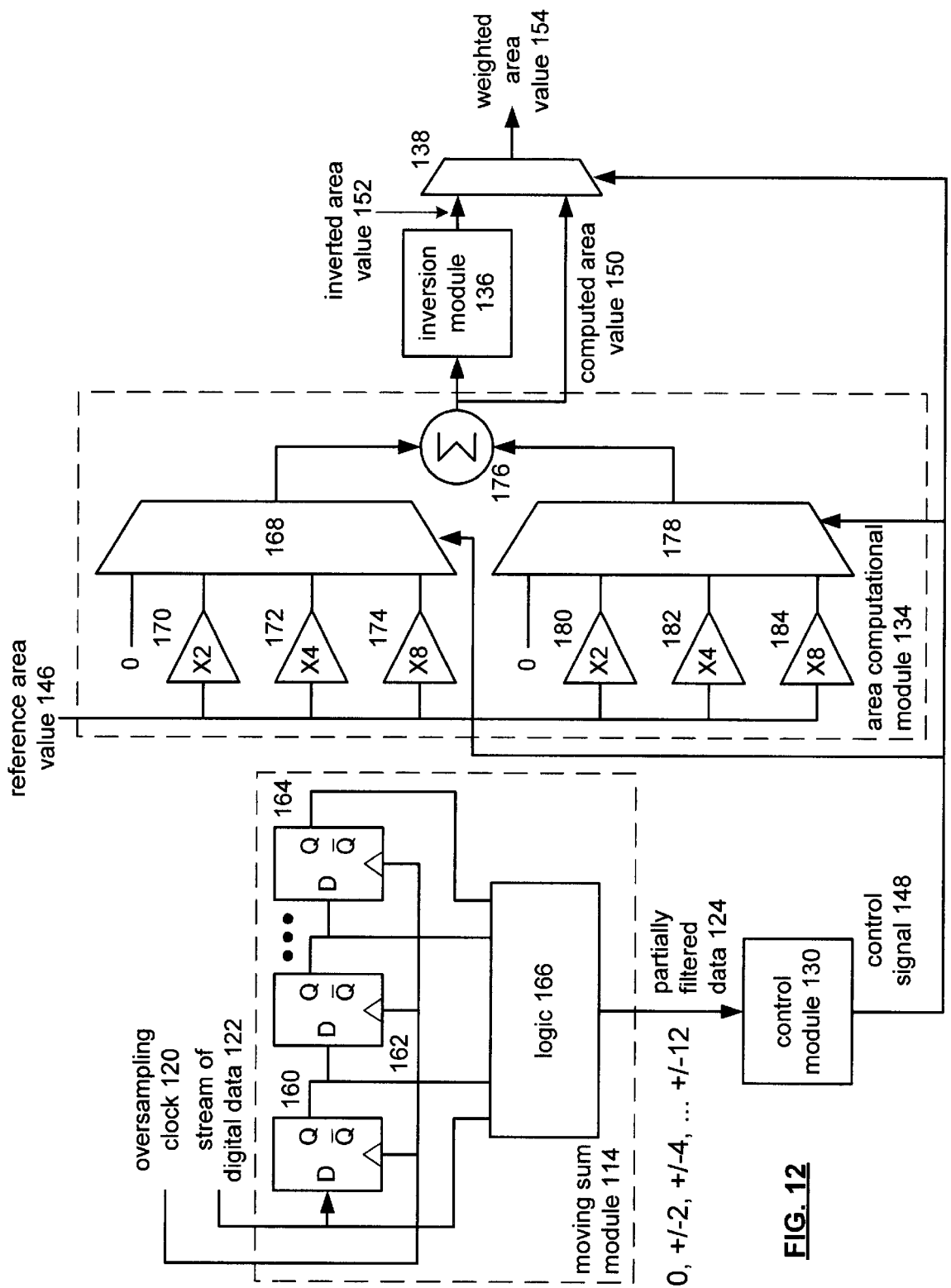
FIG. 12 illustrates a schematic block diagram of an alternate decimation filter including sample rate conversion in accordance with the present invention.

FIG. 12 illustrates a schematic block diagram of the moving sum 114 and the digital decimation filter 116 in greater detail. As shown, the moving sum modulator 114 includes a plurality of D flip-flops 160 through 164 and logic circuitry 166. Based on the over sampling clock 120, the digital stream of data 122 is clocked through the plurality of flip-flops 160–164, for example, 12 flip-flops for moving sum module 114. The initial digital value and the output of each of the flip-flops are provided to logic circuit 166. Based on these inputs, the logic circuit 166 outputs a 5-bit value wherein the $1^{st}$ bit is representative of a sign value and the other bits are representative of a numerical value of 0 through 12. As such, this 5-bit value is representative of the partially filtered data 124. The control module 130 receives the partially filtered data 124 to produce control signal 148.

The area computational module 134 is shown to include two multiplexors 168 and 178, a plurality of multipliers 170 through 174 and 180 through 184, and a summing module 176. Each of the multipliers is operably coupled to receive the reference area of value 146 and multiply it by its respective value. For example, multiplier 170 multiplies the reference value 146 by 2, multiplier 172 by 4 and multiplier 174 by 8. Depending on the partially filtered data 124, the corresponding inputs of multiplexors 168 and 178 are outputted to the summing module 176. For example, if the partially filtered data 124 indicates that the magnitude is 0, then both multiplexor 168 and 178 output 0 such that the resulting computed area value 150 is 0. If, however, the value of the partially filtered data is 2, then 0 is outputted from the $1^{st}$ multiplexor 168 and the output of multiplier 180 is outputted from multiplexor 178. As such, in this configuration the computed area value is 2 times the reference area value 146. Similarly, depending on the particular numerical value of partially filtered data 124, a multiplication of the reference value 146 may vary from 0 to 16 at intervals of 2 based on a combination of the outputs of multiplexor 168 and 178.

Based on the sign bit of the partially filtered data 124, multiplexor 138 outputs either the inverted area value 152 or the computed area value 150 as the weighted area value 154 for the given interval.

Figure 13:
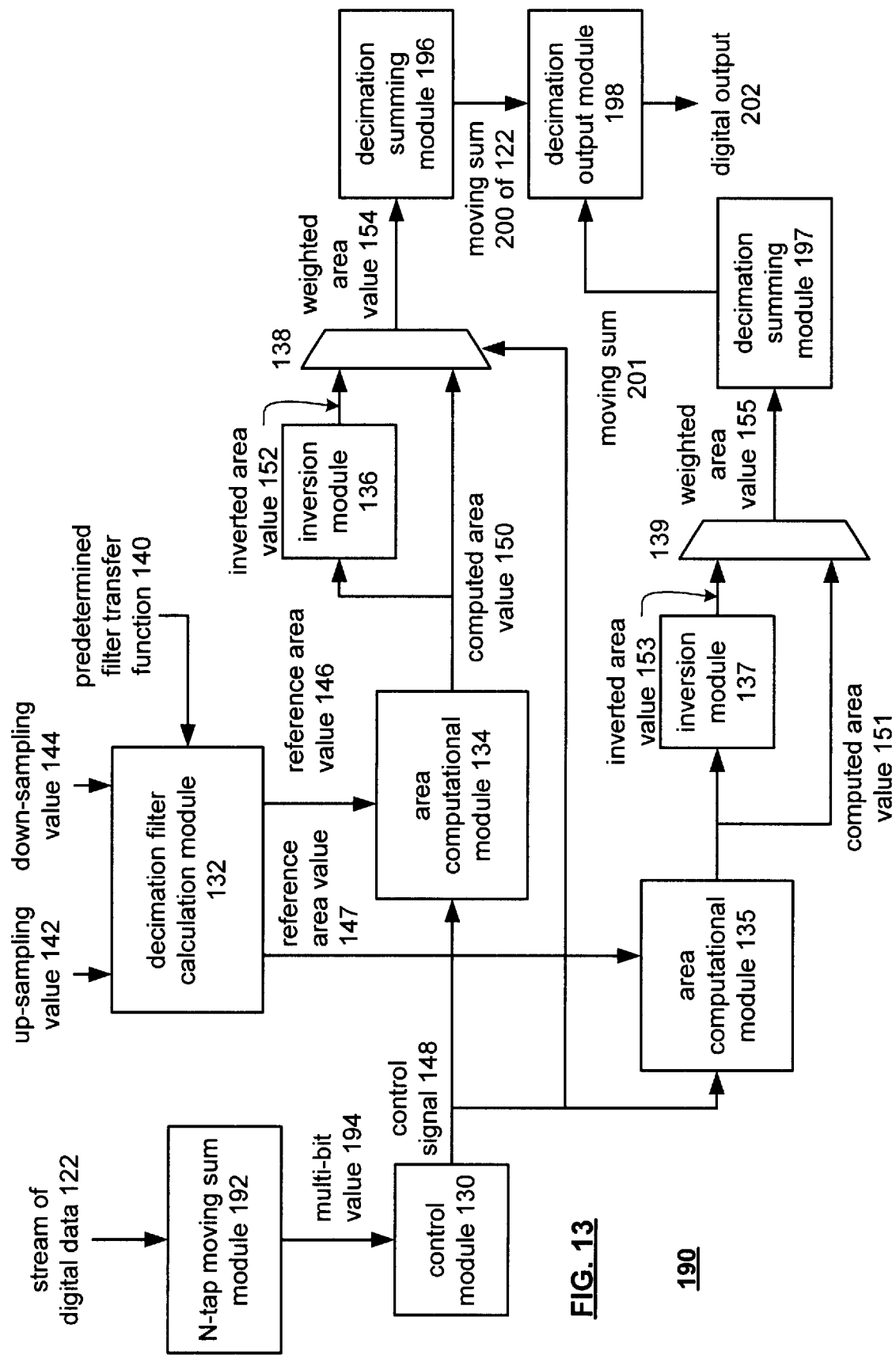
FIG. 13 illustrates a schematic block diagram of yet another decimation filter incorporating sample rate conversion in accordance with the present invention.

FIG. 13 illustrates a schematic block diagram of a decimation filter 190 that may be used in any of the analog to digital converters previously described. The decimation filter includes an N-tap moving sum module 190, control module 130, decimation filter calculation module 132, area computational module 134, inversion module 136, multiplexor 138, a decimation summing module 196 and a decimation output module 190. The N-tap moving sum module 192 receives a stream of digital data 122 to produce a multi-bit value 194. Depending on the number of taps, the moving sum module 192 may perform a similar function as previously described with reference to moving sum module 114, or may have more or less than the 12 taps of the moving sum module 114. The function of the control module 130, the decimation filter calculation module 132, the area computational module 134, the inversion module 136 and the multiplexor 138 is as previously described with reference to FIGS. 11 and 12.

The decimation summing module 196 is operably coupled to receive the weighted area value 154. The decimation summing module 196 is operably coupled to compute a moving sum 200 of the stream of digital data 122 based on an accumulation of the weighted area value 154 for a plurality of clock intervals of the over sampling rate. The number of clock intervals corresponds to the down sampling rate as previously described with reference to FIGS. 5 through 7. As such, the decimation summing module 196 computes the area under the transfer function for the corresponding digital data being received during that interval. In an analogous manner, area computational module 135, inversion module 137, multiplexor 139, and decimation summing module 197 provides an identical, but time shifted transfer function, to produce a second moving sum 201.

The decimation output module 198 is operably coupled to receive the moving sums 200 and 201 to produce a corresponding digital output value 202. The decimation output module 198 provides, in a controlled alternating manner, moving sum 200 or moving sum 201 as the digital output 202. Since the length of filter transfer function 74 is two down-sampling intervals, each area calculation completes and provides every other decimation output. Thus, the time shifted transfer function is used along with the nominal transfer function to calculate odd and even decimation outputs, respectively.

FIG. 14 illustrates a schematic block diagram of an apparatus 210 for sample rate conversion. The apparatus 210 includes a processing module 212 and memory 214. The processing module 212 may be a single processing device or a plurality of processing devices. Such a processing device may be a microprocessor, microcontroller, digital signal processor, central processing unit, state machine, logic circuitry, and/or any device that manipulates signals (analog or digital) based on operational instructions. The memory 214 may be a single memory device or a plurality of memory devices. Such a memory device may be a random access memory, read-only memory, system memory, floppy disk memory, and/or any device that stores digital information. Note that when the processing module 212 implements one or more of its functions via a state machine or logic circuitry, the memory storing the corresponding operational instructions is embedded within the circuitry comprising the state machine or logic circuitry. The operational instructions stored in memory 214 and executed by processing module 212 are illustrated in FIGS. 15 through 19.

FIG. 15 illustrates a logic diagram of a method for sample rate conversion. The process begins at Step 220 where an analog input signal is converted into a stream of digital data. The process then proceeds to Step 222 where an up sampling value and a down sampling value are determined based on a sample rate conversion value. For example, if the over sampling rate is 35 Mhz, and the maximum output sampling rate is 700 Khz, which can vary down to 70 Khz, the sampling rate conversion value is based on the desired output frequency versus the over sampling rate. From this value, integer values for the up sampling value and down sampling value may be readily determined.

The process then proceeds to Step 224 where a moving sum of the stream of digital data is computed based on the up sampling value, the clock rate of the stream of digital data (i.e. the over sampling rate), and a predetermined filter transfer function. The predetermined filter transfer function could be based on the order of a moving sum module. If the moving sum is a $1^{st}$ order, the filter transfer function will be a constant, if the moving sum is a $2^{nd}$ order, the filter transfer function will be a triangular function, for a $3^{rd}$ order moving sum, the filter transfer function will be a quadratic equation, et cetera.

The process then proceeds to Step 226 where a digital output value is produced from the moving sum based on the down sampling value, where the digital output value is at a desired output rate. The production of a digital output value in Step 226 is repeated for an time-shifted moving sum, which was illustrated in FIG. 9, for subsequent data in the stream of data.

FIG. 16 illustrates a logic diagram of a method for computing the moving sum of Step 224 of FIG. 15. The process begins at Step 228 where an initial time alignment of an output interval of the desired output rate with respect to a clock operating at the clock rate is determined to produce a partial clock interval. As such, the determination of the moving sum will rarely occur precisely at the beginning of an interval of the over sampling rate. Thus, the initial computation will correspond to a partial clock value. This was illustrated in FIG. 7.

The process then proceeds to Step 230 where a weighted area under the predetermined filter transfer function over the partial clock interval is determined based on the up sampling value and the data to produce a $1^{st}$ weighted area. The process then proceeds to Step 232 where a plurality of weighted areas under the predetermined filter transfer function are determined based on the up sampling value and the data. Note that each of the plurality of weighted areas corresponds to an interval of the clock for the down sampling interval.

The process then proceeds to Step 234 where a final partial clock interval is determined based on the partial clock interval and the output interval (i.e. the down sampling interval). The process then proceeds to Step 236 where a final weighted area is under the predetermined filter transfer function is determined over the final partial clock interval based on the up sampling value and the data. The process then proceeds to Step 238 where the $1^{st}$ weighted area, the plurality of weighted areas and the final weighted area are summed to produce a moving sum.

Figure 17:
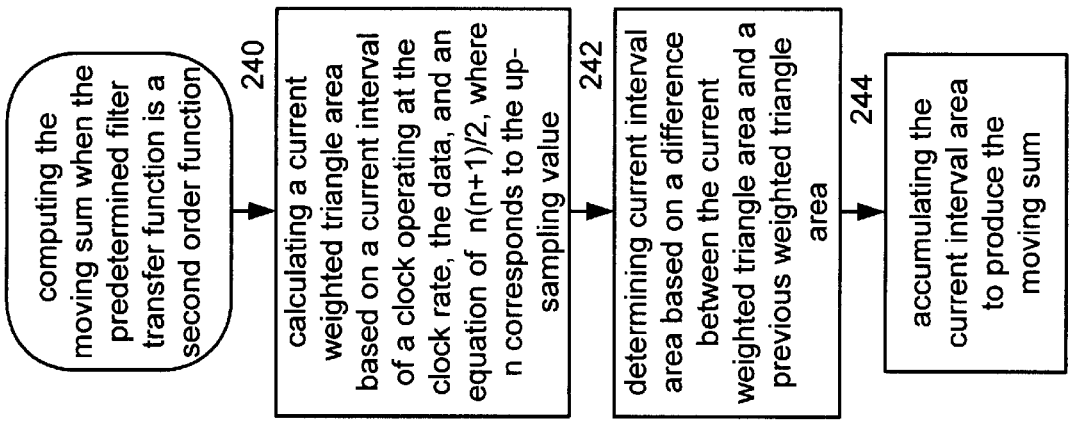

FIG. 17 illustrates a logic diagram of a method for computing the moving sum when the predetermined filter transfer function is a $2^{nd}$ order function. The process begins at Step 240 where a current weighted triangle area is calculated based on a current interval of a clock operating at the clock rate, the data and an equation of $N(N+1)\div 2$. The N in the equation corresponds to the up sampling value. The process then proceeds to Step 242 where a current interval area is determined based on a difference between the current weighted triangle area and the previous weighted triangle area. This was described with reference to FIG. 7. The process then proceeds to Step 244 where the current interval area is accumulated to produce the moving sum.

Figure 18:
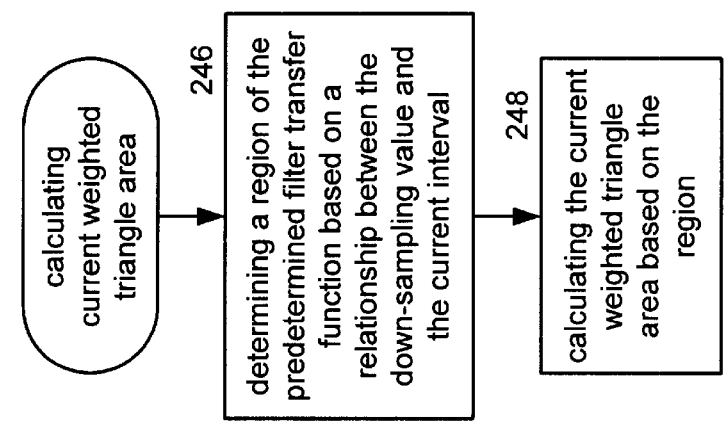

FIG. 18 illustrates a logic diagram of a method for calculating the current weighted triangle area. The process begins at Step 246 where a region of the predetermined filter transfer function is determined based on the relationship between the down sampling value and the current interval. The process then proceeds to Step 248 where the current weighted triangle area is calculated based on the region.

Figure 19:
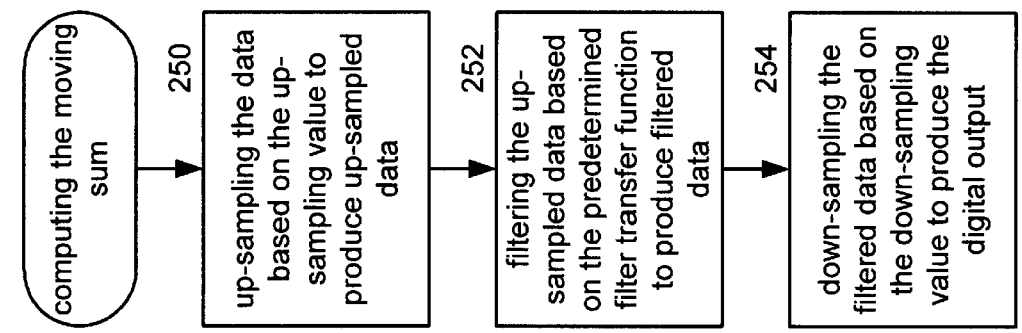

FIG. 19 illustrates a logic diagram of a method for computing the moving sum. The process begins at Step 150 where the data is up sampled based on the up sampling value to produce up sampled data. The process then proceeds to Step 252 where the up sampled data is filtered based on the predetermined filter transfer function to produce filtered data. The process then proceeds to Step 254 where the filtered data is down sampled based on the down sampling value to produce the digital output.

FIG. 20 illustrates a schematic block diagram of an apparatus 260 for analog to digital conversion. The apparatus 260 includes a processing module 262 and memory 264. The processing module 262 may be a single processing device or a plurality of processing devices. Such a processing device may be a microprocessor, microcontroller, digital signal processor, microcomputer, central processing unit, state machine, logic circuitry, and/or any device that manipulates signals (analog or digital) based on operational instructions. The memory 264 may be a single memory device or a plurality of memory devices. Such a memory device may be read-only memory, random access memory, floppy disk memory, system memory, magnetic tape memory, and/or any device that stores digital information. Note that when the processing module 262 implements one or more of its functions via a state machine or logic circuitry, the memory storing the corresponding operational instructions is embedded within the circuitry comprising the state machine or logic circuitry. The operational instructions stored in memory 264 and executed by processing module 262 are illustrated in the logic diagrams of FIGS. 21 through 31.

FIG. 21 illustrates a logic diagram of a method for analog to digital conversion. The process begins at Step 270 where an analog input signal is quantized to produce a stream of digital data at an over sampling rate. The process then proceeds to Step 272 where the partially filtered data is produced from the stream of digital data based on a moving sum of the stream of digital data. The process then proceeds to Step 274 where the partially filtered data is filtered via a decimation filter to produce a digital output value.

FIG. 22 illustrates a logic diagram of the decimation filtering of FIG. 21. The process begins at Step 276 where a control signal is produced from the partially filtered data. The process then proceeds to Step 278 where a reference area value is produced per clock interval of the over sampling rate based on an up sampling value, a down sampling value, and a predetermined filter transfer function. Note that the up sampling value and the down sampling value are related based on a sample rate conversion value.

The process then proceeds to Step 280 where a computed area value is produced from the reference area value based on the control signal. This was described in reference to FIGS. 11 through 13. The process then proceeds to Step 282 where the computed area value is inverted to produce an inverted area value. The process then proceeds to Step 284 where the computed area value or the inverted area value is outputted as a weighted area value for a current clock interval. The selection of the computed area value or the inverted area value is determined based on the control signal.

FIG. 23 illustrates a logic diagram of alternate decimation filtering of FIG. 21. The process begins at Step 286 where a moving sum of the data of the stream of digital data is computed based on an accumulation of a weighted area value for a plurality of clock intervals of the over sampling rate. The process then proceeds to Step 288 where the digital output value is produced from the moving sum based on a down sampling value, wherein the digital output value is at a desired output rate. This was described graphically with reference to FIG. 13.

FIG. 24 illustrates a logic diagram of a method for producing the computed area value. The process begins at Step 290 where a plurality of multiple reference area values is produced from the reference area value. The process then proceeds to Step 292 where a $2^{nd}$ plurality of multiple reference area values is produced from the reference area value. The process then proceeds to Step 294 where one of the $1^{st}$ plurality of multiple reference area values are outputted as a $1^{st}$ area value based on the control signal. The process then proceeds to Step 296 where one of the $2^{nd}$ plurality of multiple reference area values is outputted as the $2^{nd}$ area value based on the control signal. The process then proceeds to Step 298 where the $1^{st}$ and $2^{nd}$ area values are summed to produce a computed area value. This was graphically illustrated with reference to FIG. 12.

FIG. 25 illustrates a logic diagram of decimation filtering. The process begins at Step 300 where the partially filtered data is up sampled based on an up sampling value to produce up sampled data. The process then proceeds to Step 302 where the up sampled data is filtered to produce sampled filtered data. The process then proceeds to Step 304 where the up sampled filtered data is down sampled based on a down sampling value to produce a digital output at the desired output rate.

FIG. 26 illustrates a logic diagram of a method for analog to digital conversion. The process begins at Step 310 where an analog input signal is quantized to produce a $1^{st}$ stream of digital data and an analog output. The process then proceeds to Step 312 where the analog output is quantized to produce a $2^{nd}$ stream of digital data. The process then proceeds to Step 314 where the $1^{st}$ stream of digital data is filtered to produce a $1^{st}$ decimated digital data. The process then proceeds to Step 316 where the $2^{nd}$ stream of digital data is filtered to produce a $2^{nd}$ decimated digital data. The process then proceeds to Step 318 where the filtered $1^{st}$ and $2^{nd}$ decimated digital data is recombined to produce a digital output.

FIG. 27 illustrates a logic diagram of decimation filtering of the $1^{st}$ stream of digital data. The process begins at Step 320 where partially filtered data is produced from the $1^{st}$ stream of digital data. The process then proceeds to Step 322 where the $1^{st}$ decimated digital data is produced from the partially filtered data. This was described graphically with reference to FIG. 8.

FIG. 28 illustrates a logic diagram for producing the $1^{st}$ decimated digital data. The process begins at Step 324 where a control signal is produced from the partially filtered data. The process then proceeds to Step 326 where a reference area value per clock interval of the over sampling rate is produced based on an up sampling value, a down sampling value, at a predetermined filter transfer function. This was discussed with reference to FIGS. 11 through 13.

The process then proceeds to Step 328 where a computed area value is produced from the reference area value based on the control signal. The process then proceeds to Step 330 where the computed area value is inverted to produce an inverted area value. The process then proceeds to Step 332 where the area value or the inverted area value is outputted as a weighted area value for a current clock interval based on the control signal and a current data sample.

FIG. 29 illustrates a logic diagram of a method for producing a computed area value. The process begins at Step 334 where a $1^{st}$ plurality of multiple reference area values is produced from the reference area value. The process then proceeds to Step 336 where a $2^{nd}$ plurality of multiple reference area values is produced from the reference area value. The process then proceeds to Step 338 where one of the $1^{st}$ plurality of multiple reference area values is outputted as a $1^{st}$ area value based on the control signal. The process then proceeds to Step 340 where one of the $2^{nd}$ plurality of multiple reference area values is outputted as a $2^{nd}$ area value based on the control signal. The process then proceeds to Step 342 where the $1^{st}$ and $2^{nd}$ area values are summed to produce a computed area value. This was graphically illustrated with reference to FIGS. 12 and 13.

FIG. 30 illustrates a logic diagram of a method for producing the $1^{st}$ decimated digital data. The process begins at Step 344 where an up sampling module is operably coupled to receive the partially filtered data and to up sample the rate of the partially filtered data based on an up sampling value to produce up sampled data. The process then proceeds to Step 346 where a filter is operably coupled to filter the up sampled data to produce up sampled filtered data. The process then proceeds to Step 348 where a down sampling module is operably coupled to receive the up sampled filtered data and to down sample the up sampled filtered data based on a down sampling value to produce the $1^{st}$ decimated digital data.

FIG. 31 illustrates a logic diagram of a method for decimation filtering the $2^{nd}$ stream of data. The process begins at Step 350 where partially filtered data is produced from the $2^{nd}$ stream of data. The process then proceeds to Step 352 where the $2^{nd}$ decimation digital data is produced from the partially filtered data.

The preceding discussion has presented a method and apparatus for sample rate conversion within an analog to digital converter. By performing the sample rate conversion in the filtering process, the need for a very high clock reference is avoided. Therefore, the concepts of the present invention are widely applicable to a variety of analog to digital converters. As one of average skill in the art will appreciate, other embodiments may be derived from the teachings of the present invention without deviating from the scope of the claims.

What is claimed is:

1. A method for sample rate conversion in an analog to digital converter, the method comprises the steps of:

converting an analog input signal into a stream of digital data;

determining an up-sampling value and a down-sampling value based on a sample rate conversion value;

computing a moving sum of data of the stream of digital data based on the up-sampling value, clock rate of the stream of digital data, and a predetermined filter transfer function; and producing a digital output value from the moving sum based on the down-sampling value, wherein the digital output value is at a desired output rate.

2. The method of claim 1, wherein the computing the moving sum further comprises:

determining an initial time alignment of an output interval of the desired output rate with respect to a clock operating at the clock rate to produce a partial clock interval;

determining weighted area under the predetermined filter transfer function over the partial clock interval based on the up-sampling value and the data to produce a first weighted area;

determining a plurality of weighted areas under the predetermined filter transfer function based on the up-sampling value and the data, wherein each of the plurality of weighted areas corresponds to an interval of the clock;

determining a final partial clock interval based on the partial clock interval and the output interval;

determining a final weighted area under the predetermined filter transfer function over the final partial clock interval based on the up-sampling value and the data; and summing the first weighted area, the plurality of weighted areas, and the final weighted area to produce the moving sum.

3. The method of claim 1, wherein the predetermined filter transfer function is a second order function, wherein the computing the moving sum further comprises:

calculating a current weighted triangle area based on a current interval of a clock operating at the clock rate, the data, and an equation of $$Area = \frac{n(n+1)}{2},$$

where n corresponds to the up-sampling value;

determining current interval area based on a difference between the current weighted triangle area and a previous weighted triangle area; and accumulating the current interval area to produce the moving sum.

4. The method of claim 3, wherein the calculating the current weighted triangle area further comprises:

determining a region of the predetermined filter transfer function based on a relationship between the down-sampling value and the current interval; and calculating the current weighted triangle area based on the region.

5. The method of claim 1, wherein the computing the moving sum further comprises:

up-sampling the data based on the up-sampling value to produce up-sampled data;

filtering the up-sampled data based on the predetermined filter transfer function to produce filtered data; and down-sampling the filtered data based on the down-sampling value to produce the digital output.

6. The method of claim 1 further comprises:

computing an overlapping moving sum of second data of the stream of digital data based on the up-sampling value, the clock rate of the stream of digital data, and the predetermined filter transfer function; and producing a second digital output value from the moving sum based on the down-sampling value, wherein the second digital output value is at the desired output rate.

7. A sample rate converter for use in an analog to digital converter, wherein the analog to digital converter includes an oversampling quantizer that produces a digital stream of data at an oversampling rate from an analog input voltage, the sample rate converter comprises:

decimation filter calculation module operably coupled to produce at least one reference area value per clock interval of the oversampling rate based on an up-sampling value, a down-sampling value, and a predetermined filter transfer function, wherein the up-sampling value and the down-sampling value are related based on a sample rate conversion value;

inversion module operably coupled to receive the at least one reference area value and produce therefrom at least one inverted area value; and multiplexor operably coupled to receive, as inputs, the at least one reference area value and the at least one inverted area value, wherein the multiplexor receives, as a control signal, the digital stream of data, wherein based on a current data sample, the multiplexor outputs the at least one reference area value or the at least one inverted area as at least one weighted area value for a current clock interval.

8. The sample rate converter of claim 7 further comprises:

decimation summing module operably coupled to compute an even moving sum and an odd moving sum of data of the stream of digital data based on an accumulation of the at least one weighted area value for a plurality of clock intervals of the oversampling rate; and decimation output module operably coupled to produce a digital output value from the even and the odd moving sums based on the down-sampling value, wherein the digital output value is at a desired output rate.

9. A sample rate converter for use in an analog to digital converter, wherein the analog to digital converter includes an oversampling quantizer that produces a digital stream of data at an oversampling rate from an analog input voltage, the sample rate converter comprises:

an N-tap moving sum module operably coupled to receive the digital stream of data, wherein the N-tap moving sum module produces a multi-bit value from the digital stream of data;

control module operably coupled to receive the multi-bit value and to produce therefrom a control signal;

decimation filter calculation module operably coupled to produce at least one reference area value per clock interval of the oversampling rate based on an up-sampling value, a down-sampling value, and a predetermined filter transfer function, wherein the up-sampling value and the down-sampling value are related based on a sample rate conversion value;

area computation module operably coupled to produce at least one computed area value from the at least one reference area value based on the control signal;

inversion module operably coupled to receive the at least one computed area value and to produce therefrom at least one inverted area value; and a multiplexor operably coupled to receive, as inputs, the at least one computed area value and the at least one inverted area value, wherein the multiplexor outputs the at least one area value or the at least one inverted area as at least one weighted area value for a current clock interval based on the control signal.

10. The sample rate converter of claim 9 further comprises:

decimation summing module operably coupled to compute an even moving sum and an odd moving sum of data of the stream of digital data based on an accumulation of the at least one weighted area value for a plurality of clock intervals of the oversampling rate; and decimation output module operably coupled to produce a digital output value from the even and odd moving sums based on the down-sampling value, wherein the digital output value is at a desired output rate.

11. The sample rate converter of claim 9, wherein the area computation module further comprises:

a first set of multipliers operably coupled to receive the reference area value and produce a first plurality of multiple reference area values;

a second set of multipliers operably coupled to receive the reference area value and produce a second plurality of multiple reference area values;

a first multiplexor operably coupled to receive, as inputs, the first plurality of multiple reference area values and to receive the control signal, wherein the first multiplexor outputs one of the first plurality of multiple reference area values as a first area value;

a second multiplexor operably coupled to receive, as inputs, the second plurality of multiple reference area values and to receive the control signal, wherein the second multiplexor outputs one of the second plurality of multiple reference area values as a second area value; and summation module operably coupled to sum the first and second area values to produce the computed area value.

12. An apparatus for sample rate conversion in an analog to digital converter, the apparatus comprises:

a processing module; and memory operably coupled to the processing module, wherein the memory includes operational instructions that cause the processing module to:

convert an analog input signal into a stream of digital data;

determine an up-sampling value and a down-sampling value based on a sample rate conversion value;

compute a moving sum of data of the stream of digital data based on the up-sampling value, clock rate of the stream of digital data, and a predetermined filter transfer function; and produce a digital output value from the moving sum based on the down-sampling value, wherein the digital output value is at a desired output rate.

13. The apparatus of claim 12, wherein the memory further comprises operational instructions that cause the processing module to compute the moving sum by:

determining an initial time alignment of an output interval of the desired output rate with respect to a clock operating at the clock rate to produce a partial clock interval;

determining weighted area under the predetermined filter transfer function over the partial clock interval based on the up-sampling value and the data to produce a first weighted area;

determining a plurality of weighted areas under the predetermined filter transfer function based on the up-sampling value and the data, wherein each of the plurality of weighted areas corresponds to an interval of the clock;

determining a final partial clock interval based on the partial clock interval and the output interval;

determining a final weighted area under the predetermined filter transfer function over the final partial clock interval based on the up-sampling value and the data; and summing the first weighted area, the plurality of weighted areas, and the final weighted area to produce the moving sum.

14. The apparatus of claim 12, wherein the predetermined filter transfer function is a second order function, wherein the memory further comprises operational instructions that cause the processing module to compute the moving sum by:

calculating a current weighted triangle area based on a current interval of a clock operating at the clock rate, the data, and an equation of $$Area = \frac{n(n+1)}{2},$$

where n corresponds to the up-sampling value;

determining current interval area based on a difference between the current weighted triangle area and a previous weighted triangle area; and accumulating the current interval area to produce the moving sum.

15. The apparatus of claim 14, wherein the memory further comprises operational instructions that cause the processing module to calculate the current weighted triangle area by:

determining a region of the predetermined filter transfer function based on a relationship between the down-sampling value and the current interval; and calculating the current weighted triangle area based on the region.

16. The apparatus of claim 12, wherein the memory further comprises operational instructions that cause the processing module to compute the moving sum by:

up-sampling the data based on the up-sampling value to produce up-sampled data;

filtering the up-sampled data based on the predetermined filter transfer function to produce filtered data; and down-sampling the filtered data based on the down-sampling value to produce the digital output.

17. The apparatus of claim 12, wherein the memory further comprises operational instructions that cause the processing module to:

compute a time shifted moving sum of the stream of digital data based on the up-sampling value, the clock rate of the stream of digital data, and the predetermined filter transfer function; and produce the digital output value from the moving sum and the time shifted moving sum based on the down-sampling value, wherein the digital output value is at the desired output rate.

* * * * *